United States Patent
Tohyama et al.

(10) Patent No.: US 7,982,394 B2
(45) Date of Patent: Jul. 19, 2011

(54) DISPLAY DEVICE

(75) Inventors: Tadahisa Tohyama, Akishima (JP); Tomoyuki Shirasaki, Higashiyamato (JP); Tomomi Sawano, Fussa (JP); Tsuyoshi Ozaki, Fuchu (JP)

(73) Assignee: Casio Computer Co., Ltd., Tokyo (JP)

( * ) Notice: Subject to any disclaimer, the term of this patent is extended or adjusted under 35 U.S.C. 154(b) by 187 days.

(21) Appl. No.: 12/411,568

(22) Filed: Mar. 26, 2009

(65) Prior Publication Data

US 2009/0243482 A1 Oct. 1, 2009

(30) Foreign Application Priority Data

Mar. 28, 2008 (JP) ................................. 2008-088331

(51) Int. Cl.
*H01J 1/62* (2006.01)
(52) U.S. Cl. ........................................ 313/505; 313/506
(58) Field of Classification Search .................. 313/498, 313/503, 505, 506, 509, 512
See application file for complete search history.

(56) References Cited

U.S. PATENT DOCUMENTS 6,958,740 B1 * 10/2005 Nishikawa ...................... 345/76

FOREIGN PATENT DOCUMENTS

| JP | 2000-172199 A | 6/2000 |
| JP | 2001-195012 A | 7/2001 |
| JP | 2004-134356 A | 4/2004 |

OTHER PUBLICATIONS

Japanese Office Action dated Feb. 2, 2010 and English translation thereof issued in counterpart Japanese Application No. 2008-088331.

* cited by examiner

*Primary Examiner* — Vip Patel
(74) *Attorney, Agent, or Firm* — Holtz, Holtz, Goodman & Chick, PC

(57) ABSTRACT

A display device comprising: a light-emitting element formed on a substrate; a driver element formed on the substrate, that controls a current flowing in the light-emitting element; a switching element that switches the driver element; and a light-blocking film formed so as to correspond to only the switching element.

15 Claims, 17 Drawing Sheets

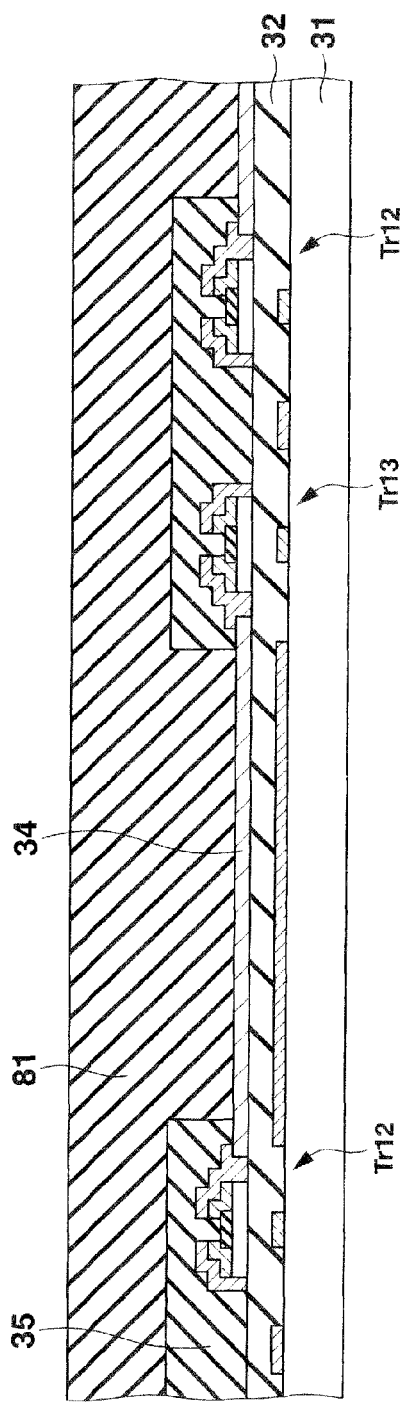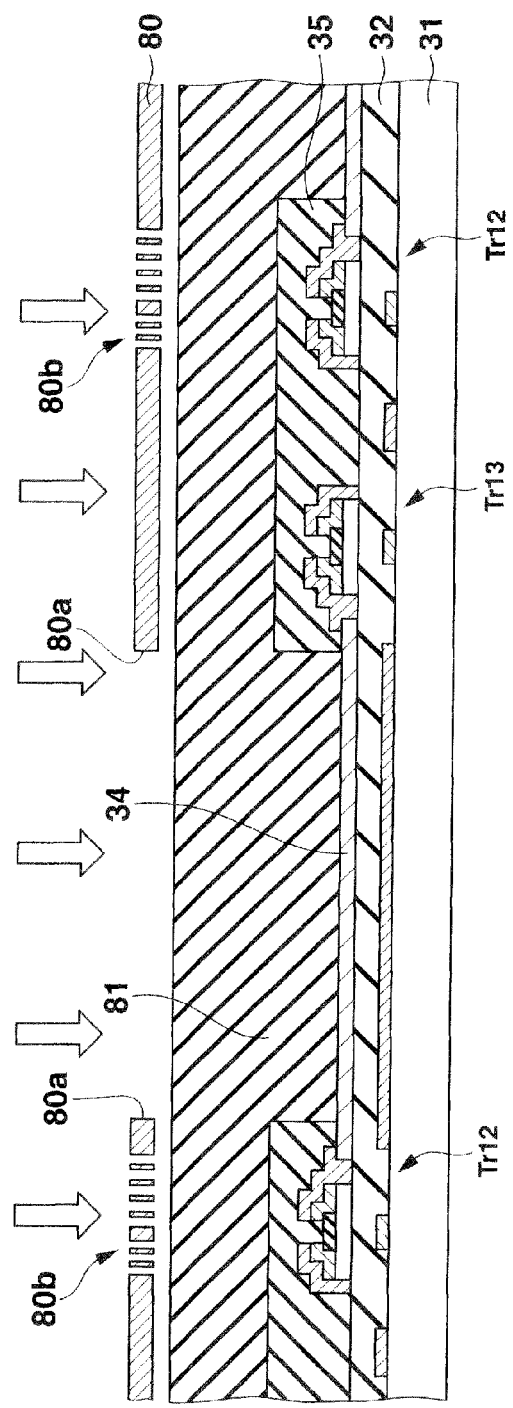

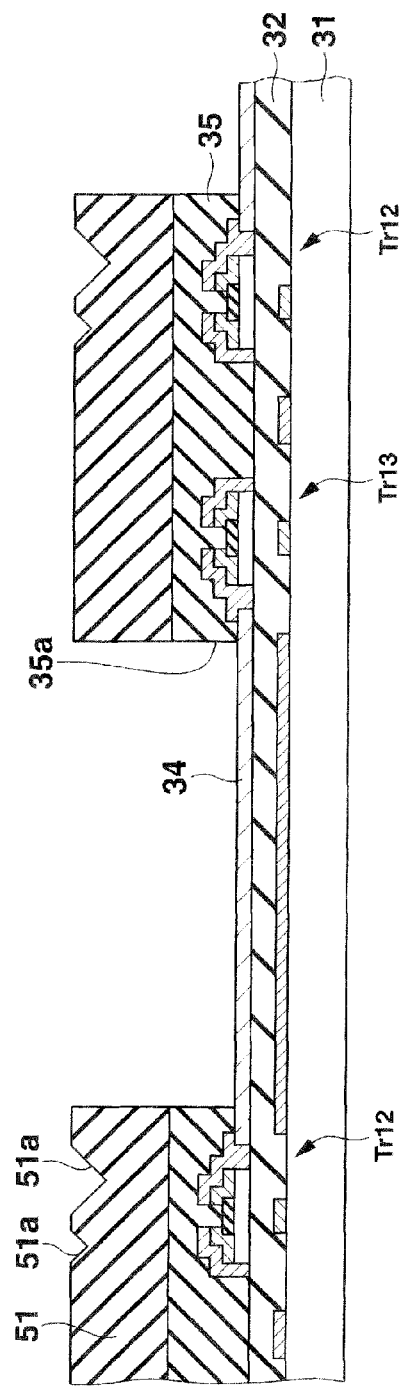
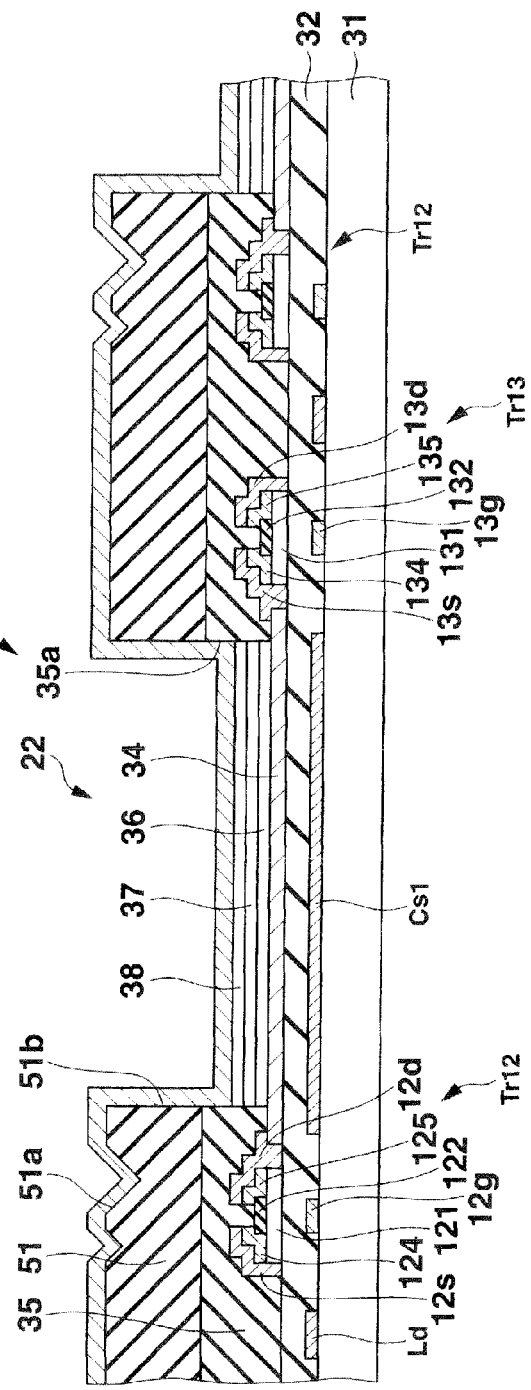
FIG.13A
FIG.13B

DISPLAY DEVICE

BACKGROUND OF THE INVENTION

1. Field of the Invention

The present invention relates to a display device employing an organic EL (electroluminescence) element.

2. Description of the Related Art

In recent years, research and development into making widespread use of display devices equipped with a light-emitting element type display panel where self-light-emitting elements such as organic electroluminescent elements (hereinafter abbreviated to "organic EL elements") are arrayed two-dimensionally a reality as the next generation of display devices superseding liquid crystal display devices (LCDS) has been making considerable progress.

The organic EL elements include an anode electrode, a cathode electrode, and an electron injection layer, a light-emitting layer, and a positive hole injection layer etc. formed between these electrodes. Light is generated at organic EL elements as a result of energy generated by the recombination of positive holes supplied by the positive hole injection layer and electrons supplied by the electron injection layer at the light-emitting layer. Such organic EL elements are used as display devices as disclosed in Unexamined Japanese Patent Application KOKAI Publication No. 2001-195012 and the driven by, for example, TFTs (Thin-Film Transistors), etc.

SUMMARY OF THE INVENTION

With TFTs, and particularly with amorphous silicon TFTs, a phenomenon can be confirmed where a gate threshold voltage Vth shifts to a plus potential side together with elapsing of drive time. The amount of light emitted by the organic EL element is decided by the amount of current flowing at the organic EL element. When the amount of light generated is controlled by the voltage applied to a driving element, a problem occurs where a threshold voltage changes, and in particular, shifts in the control of the amount of light generated occur.

A display device capable of suppressing changes in threshold voltage of the drive element due to changes over time and a method of manufacturing thereof are therefore demanded.

The present invention is therefore advantageous in providing a display device that is capable of suppressing change in threshold voltage due to changes in a drive element due to aging as a result of driving.

The display device of the present invention is comprised of:
a light-emitting element formed on a substrate;
a driver element formed on the substrate, that controls a current flowing in the light-emitting element;
a switching element that switches the driver element; and
a light-blocking film formed so as to correspond to only the switching element.

The driver element and the switching element may be amorphous silicon thin-film transistors.

The light-blocking film may be formed on an insulation film so as to cover the switching element.

The light-blocking film may be formed on the partition wall formed on the insulation film so as to cover the switching element.

The display device may also include an opposing electrode of a reflective conductive material formed so as to cover the partition wall.

The light-blocking film may also be formed from at least one of chrome (III) oxide, cobalt-iron-chrome oxide, or an amorphous silicon.

The display device may also comprise:
a scanning line;
a data line; and
an anode line.

The driver element may have a light-emitting driver transistor.

The switching element may have a first selection transistor and a second selection transistor.

A drain electrode of the light-emitting driver transistor may be connected to the anode line, and a source electrode may be connected to the light-emitting element.

A gate electrode of the first selection transistor may be connected to the scanning line, a drain electrode may be connected to the anode line, and a source electrode may be connected to the gate electrode of the light-emitting driver transistor.

A gate electrode of the second selection transistor may be connected to the scanning line, a drain electrode may be connected to the source electrode of the light-emitting driver transistor, and a source electrode may be connected to the data line.

The display device of the present invention is comprised of:
a light-emitting element formed on a substrate;
a driver element formed on the substrate, that controls a current flowing in the light-emitting element;
a switching element that switches the driver element; and
an insulation film that covers the driver element and the switching element, selectively formed with a recess at a region facing the switching element.

The insulation film may have a protective insulation film and a partition wall.

The display device may comprise an opposing electrode of a reflective conductive material formed so as to cover the partition wall.

According to the present invention, it is therefore possible to suppress changes in the threshold voltage due to aging resulting from diving of the driving element.

BRIEF DESCRIPTION OF THE DRAWINGS

These objects and other objects and advantages of the present invention will become more apparent upon reading of the following detailed description and the accompanying drawings in which:

FIGS. 12A and 12B are views showing a method of manufacturing a display device of a second embodiment of the present invention;

FIGS. 13A and 13B are views showing the method of manufacturing a display device of the second embodiment of the present invention;

FIG. 18A shows the flow of current in a selection period, and FIG. 18B shows the flow of current in a non-selected period.

DETAILED DESCRIPTION OF THE PREFERRED EMBODIMENTS

Explanations are now given using the drawings of display devices and methods for manufacturing display devices of each of the embodiments of the present invention. In the embodiments, an explanation is given centered on an active drive method display device employing a bottom emission type organic EL (electroluminescence) element.

First Embodiment

An explanation is given using the drawings of a display device and a method for manufacturing a display device of a first embodiment of the present invention.

Figure 1:
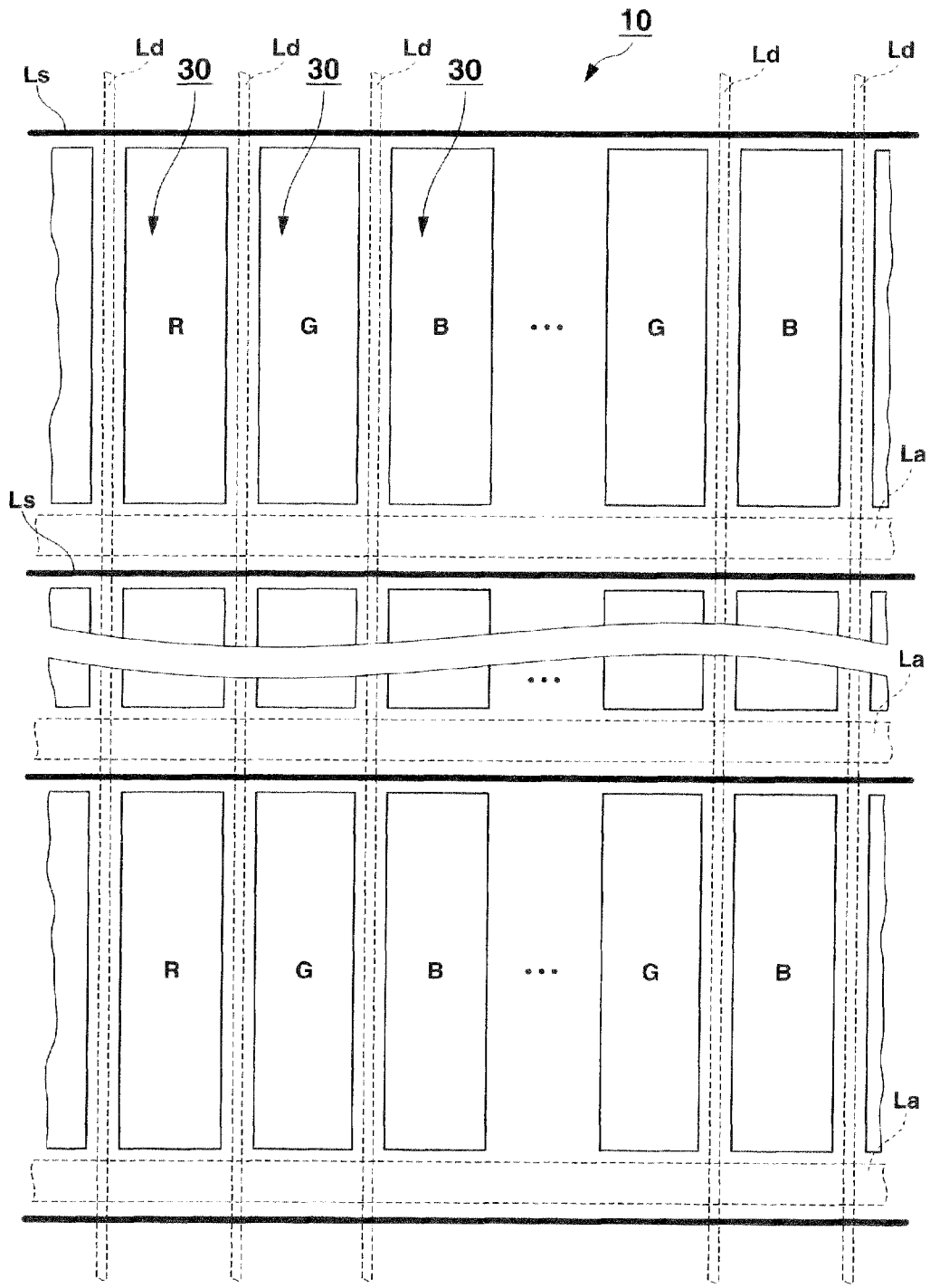
FIG. 1 is a plan view showing an example configuration of a display device of an embodiment of the present invention.
Figure 2:
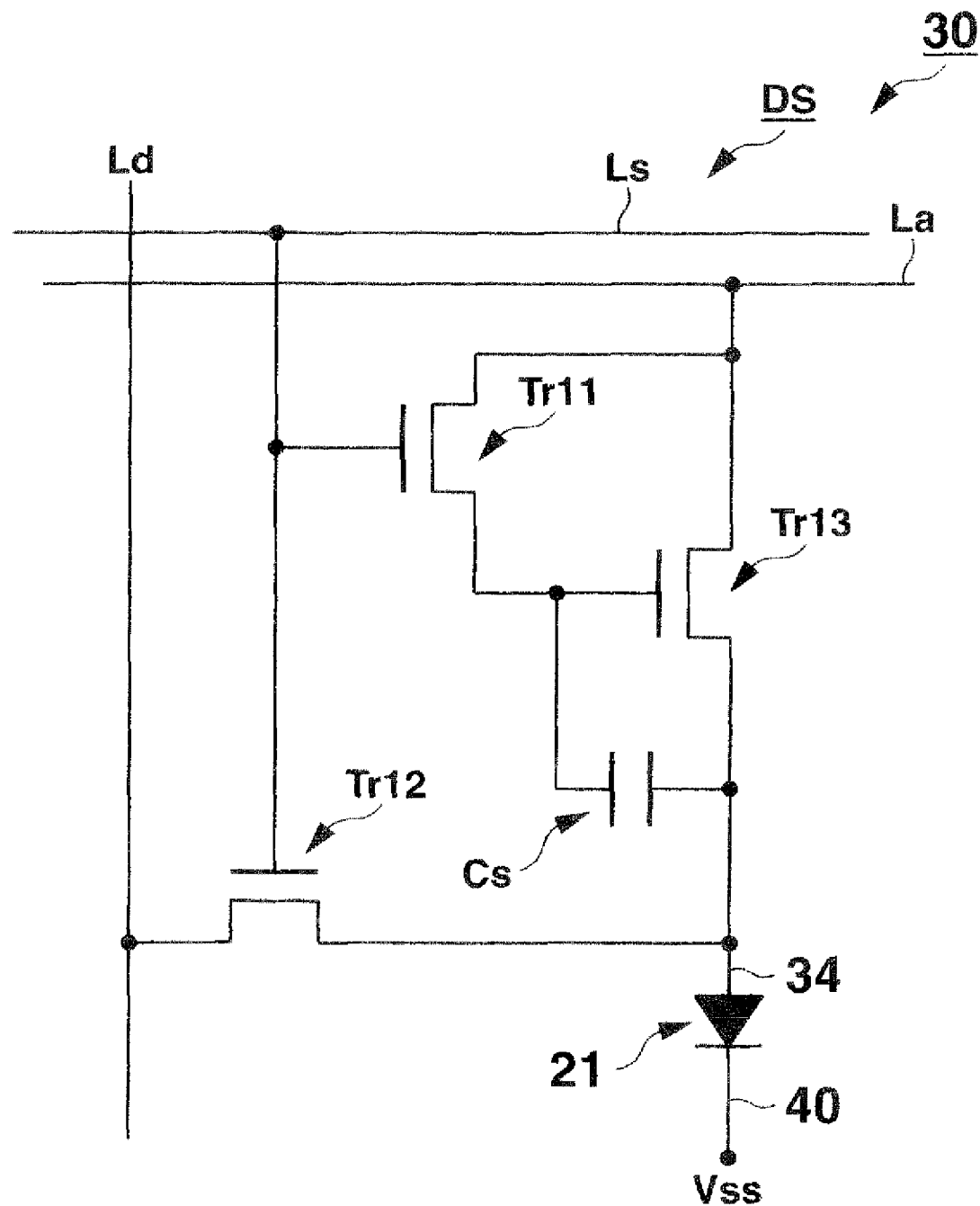
FIG. 2 is an equivalence circuit showing a pixel drive circuit.
Figure 3:
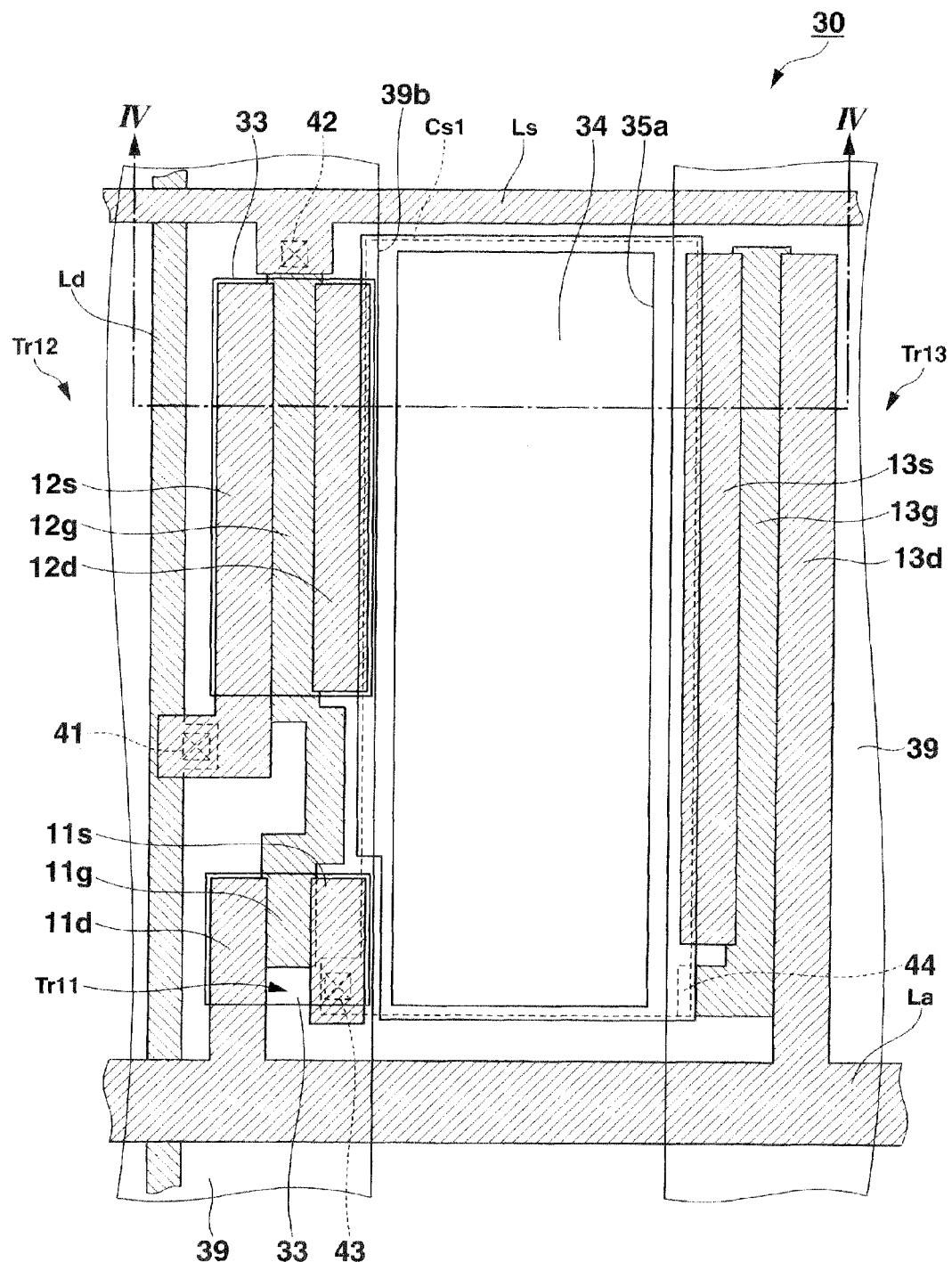
FIG. 3 is a plan view of a pixel.
Figure 4:
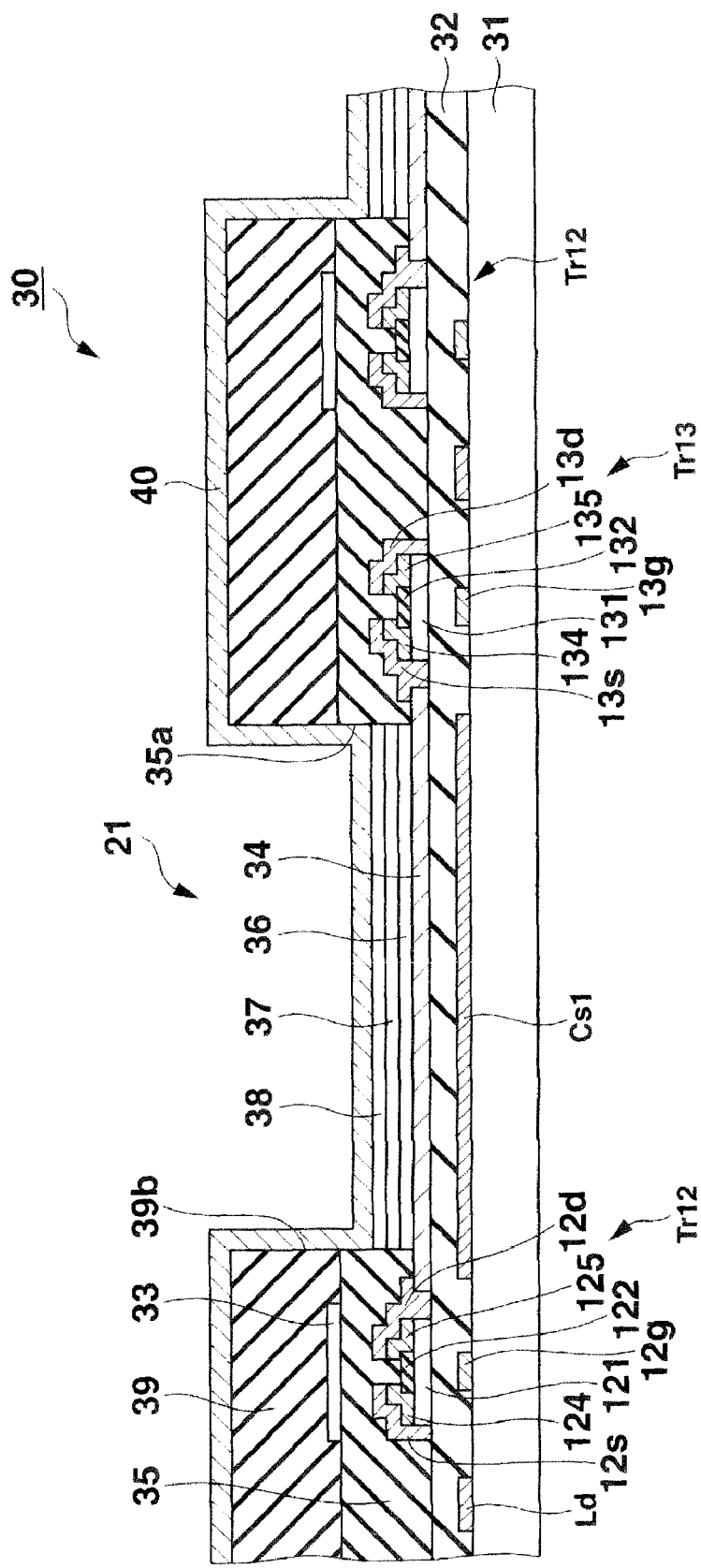
FIG. 4 is a cross-sectional view along line IV-IV shown in FIG. 3.

FIG. 1 is a view showing an example configuration for the display device of embodiments of the present invention. FIG. 2 is an equivalence circuit of a pixel drive circuit. FIG. 3 is a plan view of a pixel 30, and FIG. 4 is a cross-sectional view along line IV-IV shown in FIG. 3.

At the display device 10, three pixels 30 generating three colors of red (R), green (G), and blue (B) are provided as a group on a pixel substrate 31. A plurality of such groups is then repeatedly arrayed in a row direction (lateral direction in FIG. 1). Pluralities of pixels for the same color are arrayed in a column direction (vertical direction in FIG. 1). Pixels emitting each of the colors RGB are therefore arrayed in a matrix shape. Each pixel 30 is equipped with an organic EL element 21 that respectively emits R, G, and B light, and a pixel circuit DS that actively operates the organic EL element 21.

The pixel circuit DS includes a first selection transistor Tr11, a second selection transistor Tr12, a light-emitting driver transistor Tr13, a capacitor Cs, and the organic EL element 21. The first selection transistor Tr11, the second selection transistor Tr12, and the light-emitting driver transistor Tr13 constituted by a reverse staggered-type n-channel TFT (Thin-Film Transistor) equipped with a semiconductor layer comprised of amorphous silicon.

A plurality of anode lines La connected to a plurality of pixel circuits DS arrayed at the respective prescribed rows, an opposing electrode 40 to which a voltage Vss of, for example, ground potential is applied is a cathode formed from a single electrode layer for all of the pixels, a data line Ld connected to a plurality of pixels circuits arrayed at prescribed columns, and a plurality of scanning lines Ls that select transistors Tr11 for the plurality of circuits arrayed at the prescribed rows.

As shown in FIGS. 2 and 3, a gate electrode 11g of the first selection transistor Tr11 is connected to a scanning line Ls, and a drain electrode 11d of the first selection transistor Tr11 is connected to an anode line La. A capacitor electrode Cs1 and a gate electrode 13g of the light-emitting driver transistor Tr13 are connected together at a contact 44. A source electrode 11s of the first selection transistor Tr11 is connected to the capacitor electrode Cs1 via a contact 43 and is connected to the gate electrode 13g of the light-emitting driver transistor Tr13 via the capacitor electrode Cs1. Contacts 41 to 43 enable conduction vertically between electrodes and interconnects etc. formed at different layers. An opening is formed in a thickness direction at, for example, an insulation film 32. A lower connecting section patterned so as to constitute a gate conduction layer forming gate electrodes for the first selection transistor Tr11, the second selection transistor Tr12, and the light-emitting driver transistor Tr13, and an upper connecting section patterned so as to constitute a source-drain conduction layer that forms source-drain electrodes for the first selection transistor Tr11, the second selection transistor Tr12, and the light-emitting driver transistor Tr13 are connected at the opening.

A drain electrode 12d of the second selection transistor Tr12 is connected to the source electrode 13s of the light-emitting driver transistor Tr13 via a pixel electrode 34, and a source electrode 12s is connected to the data line Ld via the contact 41. A gate electrode 12 of the second selection transistor Tr12 is connected to the scanning line Ls via a contact 42.

A drain electrode 13d of the light-emitting driver transistor Tr13 is connected to the anode line La. The gate electrode 13g of the light-emitting driver transistor Tr13 is connected to the source electrode 11s of the first selection transistor Tr11 via the capacitor electrode Cs1. A source electrode 13s of the light-emitting driver transistor Tr13 is connected to the pixel electrode 34.

The capacitor Cs is constructed from a capacitor electrode Cs1, the pixel electrode 34, and the insulation film 32 interposed between the capacitor electrode Cs1 and the pixel electrode 34.

In an operation for writing to each pixel 30 during a selection period, a scanning signal is sequentially outputted to each scanning line by a scanning driver (not shown) and each scanning line Ls is sequentially selected. An on level (high level) voltage Von (that is sufficiently higher than ground potential) is applied to selected scanning lines Ls and a low level voltage Voff (lower than ground potential) is supplied to unselected scanning lines Ls. This means that the first selection transistor Tr11 connected to the selected scanning line Ls and the second selection transistor Tr12 are put on.

During the selection period, the power supply driver (not shown) sequentially outputs voltages to each anode line (power supply line) La according to a control signal outputted by a controller (not shown). A first power supply voltage of a low level, for example, a voltage that is of the same potential or lower than a cathode potential Vss is applied during a selection period where each transistor is selected. A second power supply voltage of a high level that is of a higher potential than the first power supply voltage is then applied to the anode line La by the power supply driver in the unselected period (light-emitting period) after the selection period.

In the selection period, a gradation signal corresponding to gradation of light emitted by the organic EL element 21 is supplied to the data line Ld by the data driver (not shown). A write voltage across the gate electrode 13g and the source electrode 13s of the light-emitting driver transistor Tr13 set in accordance with this gradation signal is held by the capacitor Cs. In the unselected period, a gradation current flows in the organic EL element 21 according to the voltage of the write voltage, and light is emitted at the desired gradation.

During this time, when a gradation signal setting gradation of light emitted by the organic EL element 21 is a voltage gradation signal controlled by a voltage value as in this embodiment, a voltage across the gate electrode 13g and the source electrode 13s of the light emitting driver transistor Tr13 that is a driving driver is set by a voltage of the voltage gradation signal. This is to say that when a gate threshold voltage of a driving driver light emitting driver transistor Tr13 changes to the high potential side as a result of deterioration due to aging, current flowing across the drain electrode 13d and the source electrode 13s of the light emitting driver transistor Tr13 that is a driving driver while a data driver applies a certain voltage to a data line Ld falls, and it becomes difficult for light to be emitted at a prescribed gradation from the organic EL element 21. It is therefore preferable for the threshold voltage of the light-emitting driver transistor Tr13 not to change substantially from an initial value.

Next, the organic EL element 21 includes the pixel electrode 34, a positive hole injection layer 36, an interlayer 37, a light-emitting layer 38, and the opposing electrode 40. The positive hole injection layer 36, the interlayer 37, and the light-emitting layer 38 are carrier transporting layers where the electrons and positive holes are carriers. The carrier transporting layers are arranged between an inter-layer insulation film 35 and a partition wall 39 arranged in a column-wise direction. The inter-layer insulation film 35 is formed by a member that is transparent with respect to light emitted by the organic EL element 21 such as, for example, silicon nitride or silicon oxide.

A light blocking film 33 for preventing light from the light-emitting layer 38 etc. from becoming incident to a semiconductor layer 111 of the first selection transistor Tr11 and a semiconductor layer 121 of the second selection transistor Tr12 is provided above the first selection transistor Tr11 and the second selection transistor Tr12. A light-blocking film is not provided at the light-emitting driver transistor Tr13. This means that a structure is therefore adopted at a semiconductor layer 131 of the light-emitting driver transistor Tr13 where it is easy for light from the light-emitting layer 38 etc. to become incident to the semiconductor layer 131.

Gate electrodes 11g 12g, 13g of the first selection transistor Tr11, the second selection transistor Tr12, and the light-emitting driver transistor Tr13 are then formed on the pixel substrate 31 for each pixel by patterning of the gate conduction layer. One electrode Cs1 of a capacitor Cs is formed on the pixel substrate 31 for each pixel. A data line Ld is then formed extending along a row-wise direction by patterning a gate conduction layer on the pixel substrate 31 neighboring each pixel. The insulation film 32 functioning as a gate insulation film and as a capacitor dielectric is formed so as to cover the electrode Cs1 and the data line Ld.

When the organic EL element 21 is a bottom emitter type element that emits display light from the side of the pixel substrate 31, the capacitor electrode Cs1 and the pixel electrode 34 are transparent electrodes such as ITO electrodes. The gate electrode 13g of the light-emitting driver transistor Tr13 is then formed so as to overlap with the capacitor electrode Cs1 at the contact 44. When the organic EL element 21 is a top emitter type element that emits display light from the side of the opposing electrode 40, the opposing electrode 40 is a transparent electrode such as ITO. However, it is not necessary for the capacitor electrode Cs1 to be transparent. The capacitor electrode Cs1 can also be made both collectively and integrally with the gate electrode 13g of the light-emitting driver transistor Tr13 by patterning the gate conduction layer. The gate conduction layer can also be patterned collectively using photolithography. The steps for manufacturing these members can therefore be made straightforward providing that a top-emission type element is adopted.

The insulation film 32 is formed from an insulating material such as, for example, silicon oxide film or silicon nitride film and is formed on the pixel substrate 31 so as to cover the data line Ld, the gate electrodes 12g, 13g, and the capacitor electrode Cs1.

The first selection transistor Tr11, the second selection transistor Tr12, and the light-emitting driver transistor Tr13 are respectively n-channel thin-film transistors (TFT: Thin Film Transistor). The transistors are formed on the pixel substrate 31 as shown in FIG. 4. As shown in FIG. 4, the second selection transistor Tr12 includes the semiconductor layer 121, a protective insulation film 122, the drain electrode 12d, the source electrode 12s, ohmic contact layers 124, 125, and the gate electrode 12g. The light-emitting driver transistor Tr13 includes the semiconductor layer 131, the protective insulation film 132, the drain electrode 13d, the source electrode 13s, the ohmic contact layers 134, 135, and the gate electrode 13g. Although omitted from the drawings, the first selection transistor Tr11 can also be constricted in the same way as the second selection transistor Tr12. As shown in FIGS. 3 and 4, a first selection transistor Tr11 is formed on the inter-layer insulation film 35, and the opaque light blocking film 33 is formed on a region facing the second selection transistor Tr12. The protective insulation films 122 and 132 and the protective insulation film for the first selection transistor Tr11 are formed of a material that is transparent with respect to light emitted by the organic EL element 21 such as, for example, silicon nitride or silicon oxide.

At each of the transistors TR11, Tr12, and Tr13, the gate electrodes can be formed from a opaque gate conduction layer such as, for example, an Mo film, a Cr film, an Al film, a Cr/Al stacked film, an AlTi alloy film or an AlNdTi alloy film, or an MoNb alloy film, etc. The gate electrodes 11g, 12g, and 13g of the first selection transistor Tr11, the second selection transistor Tr12, and the light-emitting driver transistor Tr13 formed by the gate conduction layer are opaque with respect to light emitted by the organic EL element 21. It is therefore possible to block light that encroaches in a direction towards each semiconductor layer from the lower side of the first selection transistor Tr11, the second selection transistor Tr12, and the light-emitting driver transistor Tr13. The drain electrodes and the source electrodes are made from a source-drain conductive layer such as, for example, aluminum-titanium (TlTi)/Cr, AlNdTi/Cr, or Cr etc. A configuration is adopted where source electrodes 11s, 12s, and 13s and drain electrodes 11d, 12d, and 13d of the first selection transistor Tr11, the second selection transistor Tr12, and the light-emitting driver transistor Tr13 formed by the source-drain conduction layer are opaque with respect to light emitted by the organic EL element 21. It is therefore possible to prevent light propagating from above the source electrodes and drain electrodes from becoming incident directly below However, the respective transparent protective insulation films and the inter-layer insulation film 35 are only formed between the source electrode 12s and the drain electrode 12d, and between the source electrode 13s and the drain electrode 13d. This means that light from above does become incident to regions where channels for the semiconductor layers for the first selection transistor Tr11, the second selection transistor Tr12, and the light-emitting driver transistor Tr13 are formed. An ohmic contact layer is also formed in order to provide low resistance contact between the drain electrodes and the source electrodes, and the semiconductor layer.

The pixel electrodes (anode electrodes) 34 are made from a conductive material having transparency, for example, ITO (Indium Tin Oxide), or Zn, etc. Each pixel electrode 34 is insulated by the pixel electrodes 34 of neighboring other pixels 30 and the inter-layer insulation film 35.

The inter-layer insulation film 35 is formed between the pixel electrodes 34 and insulates between neighboring pixel electrodes 34. Further, the inter-layer insulation film 35 is formed so as to cover the transistors Tr11, Tr12, and Tr13, the scanning lines Ls, and the anode lines La, etc. A plane-shaped substantially rectangular opening 35a is formed at the inter-layer insulation film 35 and the insulation film 32. A light-emitting region for the pixels 30 is then defined by this opening 35a. A groove-shaped opening 39b extending in a column direction (vertical direction of FIG. 7) is formed at the partition wall 39 so as to span a number of pixels 30. The light blocking film 33 is formed between the inter-layer insulation film 35 and the partition wall 39.

The light blocking film 33 is formed on the inter-layer insulation film 35. Light emitted by the organic EL element 21 and external light incident from outside of the display device 10 can therefore be suppressed from becoming incident to regions where channels for semiconductor layers for the first selection transistor Tr11 for the second selection transistor Tr12, respectively, are formed. The light blocking film 33 is therefore formed from a material having prescribed light blocking properties. The light blocking film 33 is therefore formed from any of at least, for example, chrome (III) oxide, cobalt-iron-chrome oxide, or amorphous silicon.

In this embodiment, as shown in FIG. 3, the light blocking film 33 is only formed on the first selection transistor Tr11 and the second selection transistor Tr12 that perform the switching operation. The light blocking film 33 is not formed on the light-emitting driver transistor Tr13. In particular, as described in detail in the following, an action occurs where the gate threshold voltage shifts to the plus side as the drive time increases in TFTs employing amorphous silicon. However, when an amorphous silicon TFT is continuously driven in a state where light is irradiated, an action occurs where the threshold voltage shifts to the minus side. It is therefore possible to maintain the threshold voltage at a state close to the initial state utilizing this phenomenon by ensuring that light enters into the light-emitting driver transistor Tr13 that is substantially affected by changes in the threshold voltage and by then ensuring that an amount of shift in the threshold voltage towards the plus direction due to aging resulting from driving is canceled out by the amount of shift in the minus direction due to the light. Leakage current then occurs due to the irradiation of light at the transistors Tr11 and Tr12 carrying out the switching operation. This causes the control of the emitted light to become unstable and it is therefore preferable for light not to enter. The size of the transistors Tr11 and Tr12 is small compared to the transistor Tr13. This means that the influence of the change in threshold voltage as a result of aging as a result of driving is small compared to that for the transistor Tr13. This means that in this embodiment, a light blocking film is only formed on Tr11 and Tr12 that carry out the switching operation.

The partition wall 39 is formed on the light blocking film 33 and the inter-layer insulation film 35 using an insulating material such as photosensitive resin such as, for example, polyimide etc. The partition wall 39 is formed in the shape of the stripe as shown in FIG. 3 and has the opening 39b. The partition wall 39 forms a partition so that liquid containing a material constituting the light-emitting layer 38 for R (red) pixels 30, liquid containing material constituting the light-emitting layer 38 for G (green) pixels 30, and liquid containing material constituting the light-emitting layer 38 for B (blue) pixels 30 formed on the pixel electrodes 34 does not flow out to pixels 30 generating light of different colors neighboring in a row direction and prevents color mixing of the light-emitting layer 38. The plane-shape of the partition wall 39 is not limited and can also be a lattice.

The positive hole injection layer 36 is formed on the pixel electrodes 34 and has a function for providing positive holes to the light-emitting layer 38. The positive hole injection layer 36 injects positive holes (holes) and is made of an organic polymer material capable of transporting. An aqueous solution of PEDOT/PSS that is a dispersion fluid where, for example, a conductive polymer of polyethylenedioxythiophene (PEDOT) and a dopant of polystyrene sulphonic acid (PSS) are dispersed in a water-based solvent can be taken as the organic compound-containing liquid including organic polymer hole injection/carrier material.

The interlayer 37 is formed on the positive hole injection layer 36. The interlayer 37 has a function for suppressing the extent to which the positive hole injection layer 36 injects positive holes so that the recombination of electrons and positive holes within the light-emitting layer 38 is accomplished more easily and is provided in order to increase the light-emitting efficiency of the light-emitting layer 38.

The light-emitting layer 38 is formed on the interlayer 37. The light-emitting layer 38 has a function for generating light as the result of the application of a voltage across the anode electrodes and the cathode electrodes. The light-emitting layer 38 can be constructed from a well-known high-polymer material that is capable of being fluorescent or phosphorescent such as red (R), green (G), and blue (B) light-emitting material including a conjugated double-bond polymer such as, for example, polyparaphenylene vinylene, or polyfluorine etc. Further, it is also possible for the light-emitting materials to be formed by applying a fluid (dispersion fluid) dissolved (or dispersed) in an appropriate water-based solvent or an organic solvent such as tetrahydronaphthalene, tetramethylbenzene, mesitylene, or xylene. The solvent is then volatized.

The opposing electrode (cathode electrode) 40 is provided at the side of the light-emitting layer 38 in the case of a bottom emission type element and has a laminated structure having a layer of conductive material that is a material of a low work function such as, for example, Li, Mg, Ca, or Ba etc. and a reflective conductive layer such as Al. In the case of a top emission type, the opposing electrode (cathode electrode) 40 is provided at the side of the light-emitting layer 38 and has a transparent laminated structure having a transparent low work function layer composed of an extremely thin film in the order of 10 nm thick of a material of a low work function such as, for example, Li, Mg, Ca, or Ba, and a light reflecting conductive lower such as an ITO layer of a film thickness in the order of 100 to 200 nm. In this embodiment, the opposing electrodes 40 are constructed from a single electrode layer formed along the plurality of pixels 30, and are applied with a common voltage Vss that is, for example, ground potential.

Figure 18A:
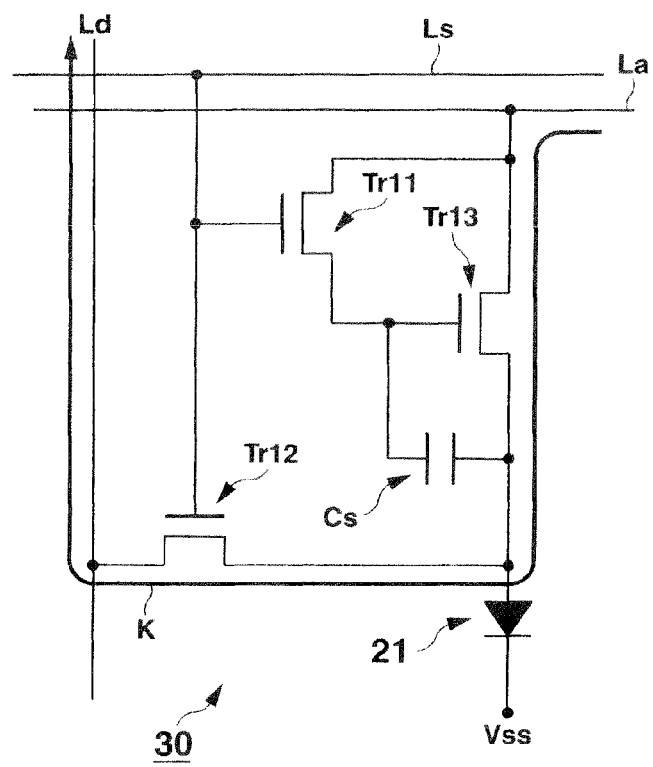
FIGS. 18A and 18B are equivalence circuit diagrams indicating pixel circuit structure and drive theory, where
Figure 18B:
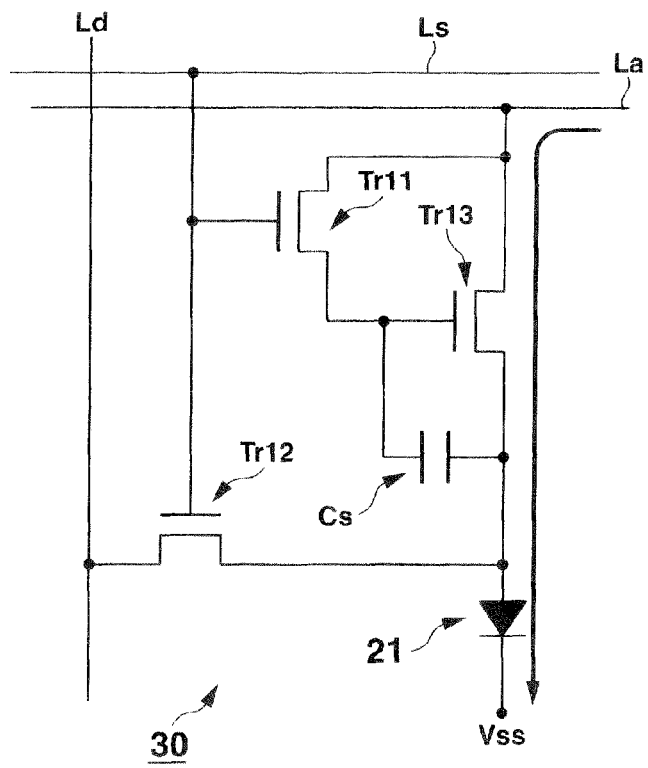

FIGS. 18A and 18B are equivalence circuit diagrams showing driving of the pixels 30.

Figure 19:
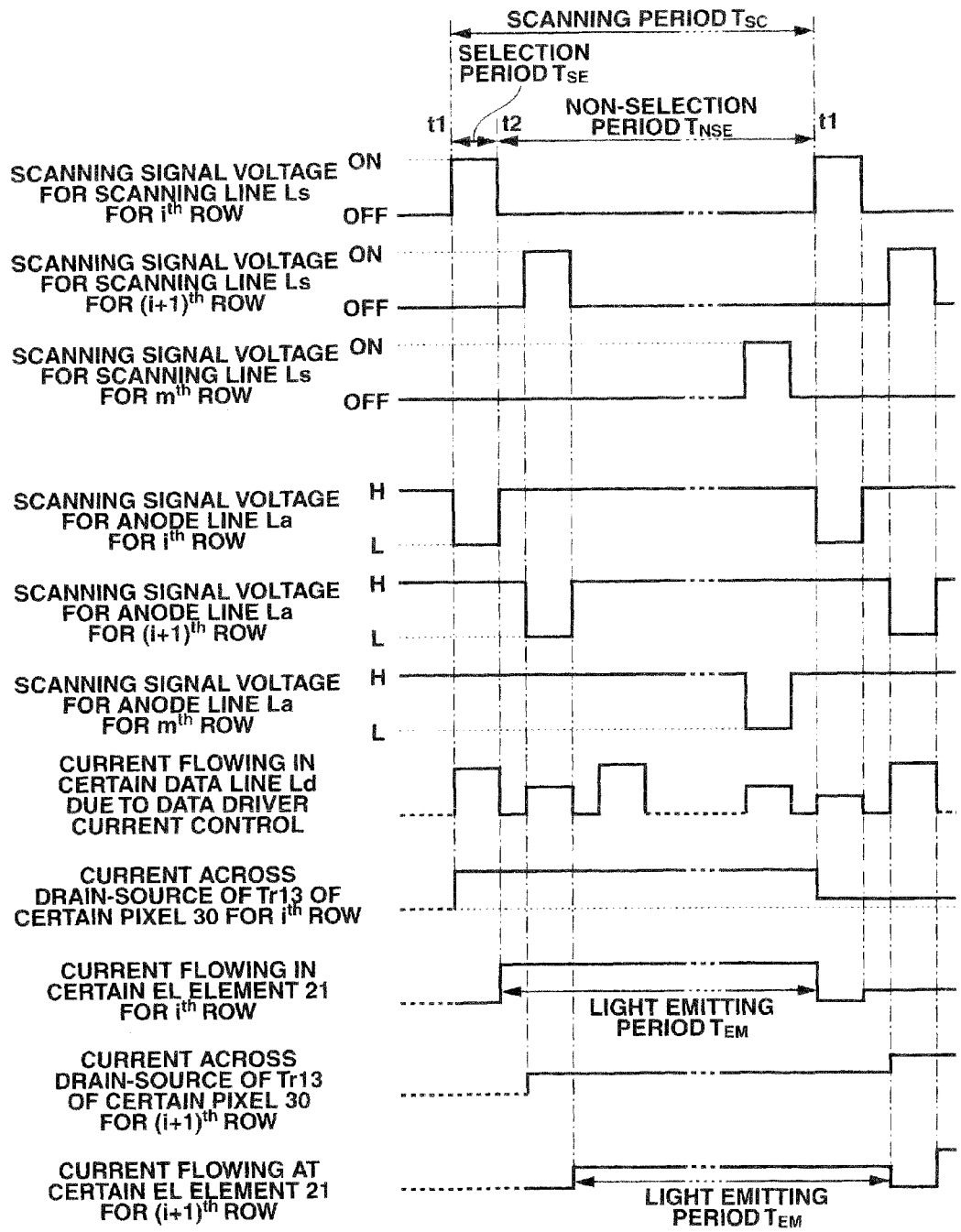
FIG. 19 is a timing chart indicating operation.

Next, an explanation is given of the operation of the pixel 30 for the $i^{th}$ row and the display device 10 configured as described above using the timing chart of FIG. 19. In FIG. 19, a period $T_{SF}$ is a selection period, and a period $T_{NSE}$ is a non-selection period. A period $T_{SC}$ is a single scanning period. Therefore. $T_{SC}=T_{SE}+T_{NSE}$.

A driver scanning in accordance with a control signal group outputted by a control circuit outputs a pulse of sequentially high levels (on level ON) from the first scanning line Is to the $m^{th}$ scanning line Ls (where m is a natural number of two or more). A driver that provides a power supply in accordance with a control signal group outputted by the control circuit outputs of a pulse of sequentially low levels L from an anode line La for a first row to an anode line La for an nth row.

As shown in FIG. 19, at each row, the timing at which a pulse for an on level ON for the scanning line Ls is outputted is synchronized with the timing at which a pulse of a low level L for the anode line La is outputted. The time length of the pulse for the on level signal ON of the scanning line Ls and the pulse of the low-level L for the anode line La is therefore substantially the same. A period where a pulse for an on level ON for a scanning line Ls and a pulse for a low-level L for an anode line La are outputted is a selection period $T_{SE}$ for this row. A data driver then generates a sync current (i.e. a current flowing towards the data driver) at the data lines Ld for all of the columns in accordance with the control signal group outputted by the control circuit during the selection period $T_{SE}$ for each row. The data driver then that enables a sync current to flow at the $j^{th}$ data line of each column using a current value corresponding to image data received by the control circuit.

A detailed explanation is now given of the current flowing and the voltage applied at each pixel 30. A high-level (on level ON) pulse is outputted from the scanning driver to the scanning line Ls for the $i^{th}$ row at a start time $t_1$ for the selection period $T_{SE}$ for the $i^{th}$ row. A scanning signal voltage of a level that ensures that the first selection transistor Tr11 and the second selection transistor Tr12 go on is applied to the scanning line Ls for the $i^{th}$ row during the selection period $T_{SE}$ of the time $t_1$ to a time $t_2$. At a start time $t_1$ of the selection period $T_{SE}$ for the $i^{th}$ row, a pulse signal of a low level L is outputted from the power supply driver to the anode line La of the $i^{th}$ row. A power supply signal voltage that is the same potential as or lower than a reference potential Vss is then applied to the anode line La during the selection period $T_{SE}$. The data driver causes a sync current of a prescribed current value to flow in accordance with the image data received by the control circuit in the selection period $T_{SE}$.

This means that at the selection period $T_{SE}$, the first selection transistor Tr11 is put on, current flows from the drain to the source, a voltage is applied to the gate of the light-emitting driver transistor Tr13 and one end of the capacitor 13, and the light-emitting driver transistor Tr13 is put on. In the selection period TSE, the second selection transistor Tr12 goes on, and a sync current for controlling current using the data driver where a voltage is equal to or less than the power supply signal voltage V and equal to or less than the reference voltage Vss flows at the data lines Ld for each column. The potential of the source electrode 13s of the light-emitting driver transistor Tr13 becomes lower than the potential of the drain electrode 13d.

The potential of the gate electrode 13d of the light-emitting driver transistor Tr13 is equal to the potential of the drain electrode 13d. A potential difference therefore occurs across the gate and source of the light-emitting driver transistor Tr13 and a sync current I of a current value (i.e. a current value in accordance with the image data) in accordance with voltages specified by the respective data drivers flows in a direction shown by an arrow K at the data line Ld. In the selection period TSE, the power supply signal voltage of the anode line La is the reference voltage H or less. The potential of the anode of the organic EL element 21 therefore becomes lower than the potential of the cathode and a reverse bias voltage is therefore applied to the organic EL element 21. This means that current does not flow from the anode line La to the organic EL element 21.

At this time, a voltage occurs across the ends of the capacitors 13 for each of the pixels 30 that correspond to the value of current flowing across the drain electrode 13d and the source electrode 13s of the light-emitting driver transistor Tr13 based on a gradation signal controlled by the data driver. This is to say that a charge that causes a potential difference across the gate and source of each of the light-emitting driver transistors Tr13 is charged so that currents I conforming to the respective gradation signals are caused flow at the light-emitting driver transistors Tr13 for each of the pixels 30.

The potential at arbitrary points of the interconnects etc. from the light-emitting driver transistor Tr13 to the data line Ld for the $j^{th}$ column changes due to the internal resistance varying with the aging of the second selection transistor Tr12 and the light-emitting driver transistor Tr13. However, when the gradation signal for the data driver is a current signal of a current corresponding to the gradation, it is possible for the value of current for current of a prescribed gradation flowing in the direction shown by the arrow K not to change even if the potential across the gate and source of the light-emitting driver transistor Tr13 changes by making the resistance of the second selection transistor Tr12 and the light-emitting driver transistor Tr13 high.

At the end time $t_2$ of the selection period $T_{SE}$, a pulse outputted from the scanning driver to the scanning line Ls of the $i^{th}$ row is switched over from an on level ON to an off level OFF and a pulse outputted from the power supply driver to the anode line La is switched over from a low level L to a high-level H. During the non-selection period $T_{NSE}$ from the end time $t_1$ to the start time $t_1$ of the next selection period $T_{SF}$, an off level OFF (low level) scanning signal voltage $V_{Xi}$ is applied to the gate of the first selection transistor Tr11 and the gate of the second selection transistor Tr12 at the $i^{th}$ scanning line Ls. The power supply signal voltage applied to the anode line La is then a power supply voltage H sufficiently higher than the reference potential $V_{SS}$ and the potential low level L outputted at the selection period $T_{SF}$.

As a result, as shown in FIG. 18B, at the non-selection period $T_{NSE}$, the second selection transistor Tr12 for the non-selected row is off, and current does not flow in the second selection transistor Tr12. At the non-selection period $T_{NSE}$, the first selection transistor Tr11 goes off, the capacitor 13 continues to retain a charge across its ends, and the light-emitting driver transistor Tr13 continues to maintain an on state. This is to say that a voltage $V_{GS}$ across the gate and source of the light-emitting driver transistor Tr13 is the same at the non-selection period $T_{NSE}$ and the selection period $T_{SE}$ prior to this non-selection period $T_{NSE}$. This means that even in the non-selection period $T_{NSE}$, the light-emitting driver transistor Tr13 ensures that a current of a current value corresponding to the image data continues to flow, and the current of the non-selection period $T_{NSE}$ is equal to the current of the selection period TSE prior to this non-selection period $N_{SE}$. The current flowing at the light-emitting driver transistor Tr13 during the non-selection period $T_{NSF}$ flows at the organic EL element 21 and light is emitted at a brightness corresponding to the value of the current flowing at the organic EL element 21. The organic EL element 21 emits light at a brightness gradation corresponding to the gradation signal.

When the selection period for the scanning line Ls for the $i^{th}$ row ends, the selection period TSE for the subsequent scanning line LS for the $(i+1)^{th}$ row starts, and the scanning driver, the power supply driver, the data driver, and a control circuit then operate in the same way for the scanning line Ls for the $i^{th}$ row. After the selection periods sequentially complete for all of the scanning lines Ls, the selection period $T_{SE}$ for the scanning line Ls starts again. The light-emitting periods $T_{EM}$ where each pixel emits light within a single scanning period $T_{SC}$ substantially corresponds to the non-selection period $T_{NSE}$.

Figure 5A:
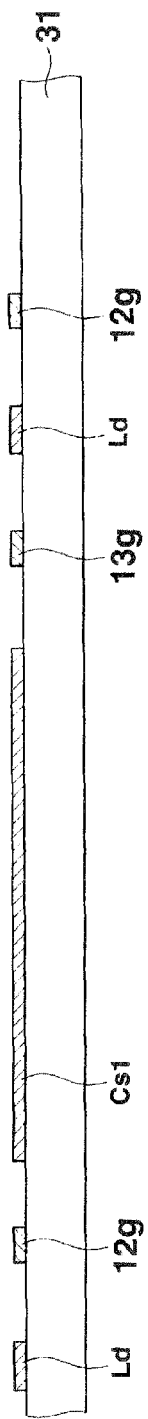
FIGS. 5A to 5C are views showing a method of manufacturing a display device of an embodiment of the present invention.
Figure 5B:
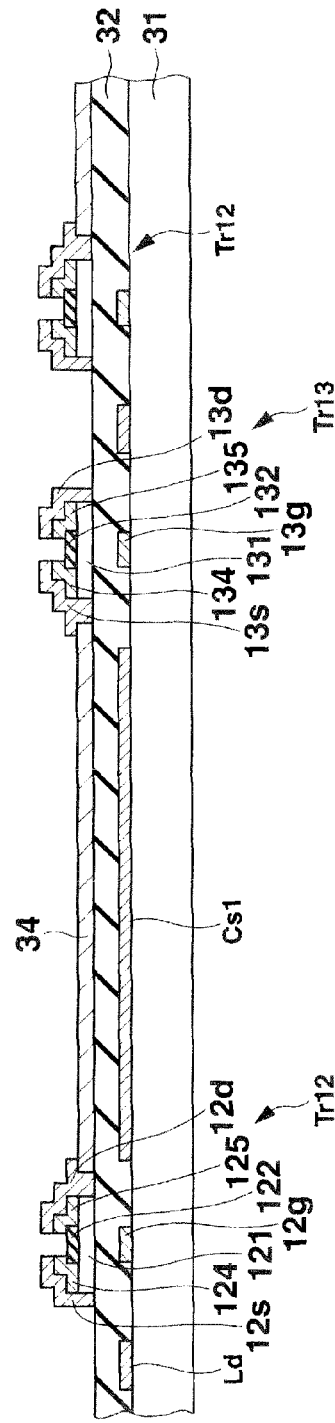
Figure 5C:
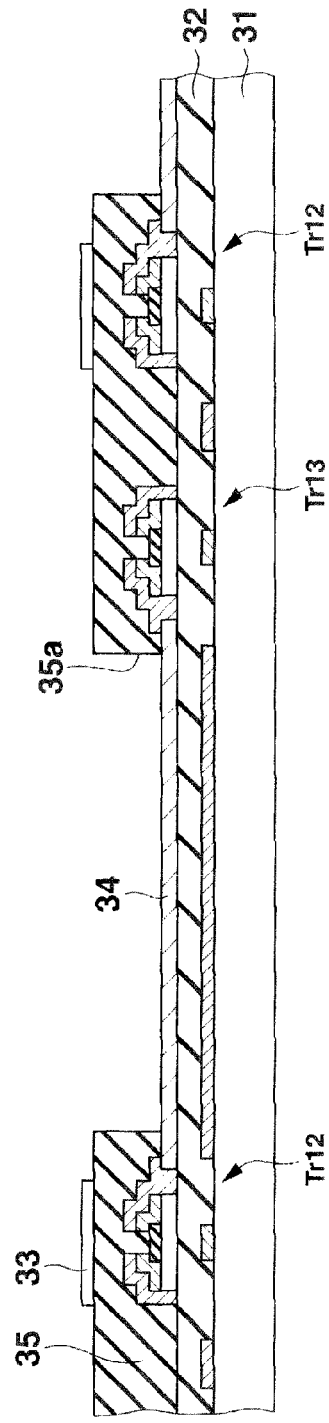
Figure 6A:
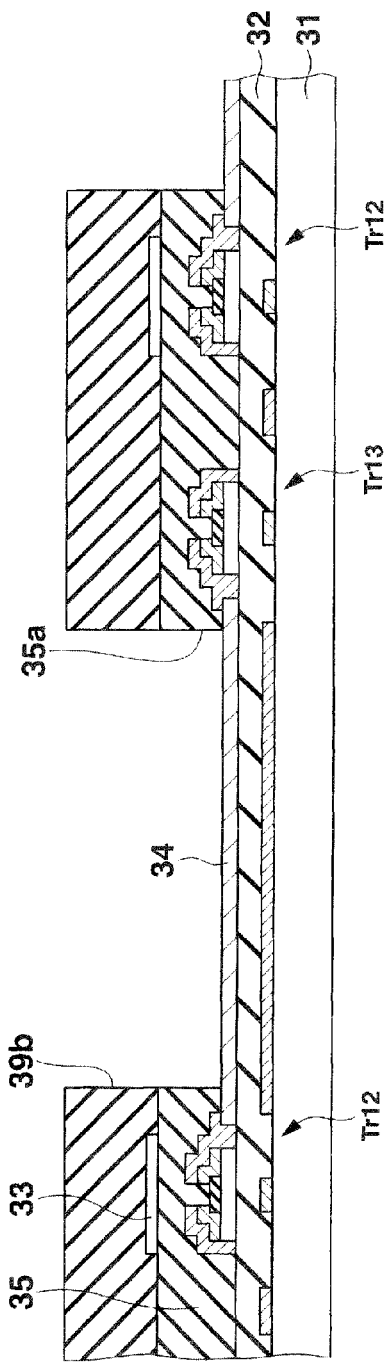
FIGS. 6A to 6B are further views showing the method of manufacturing a display device of an embodiment of the present invention.
Figure 6B:
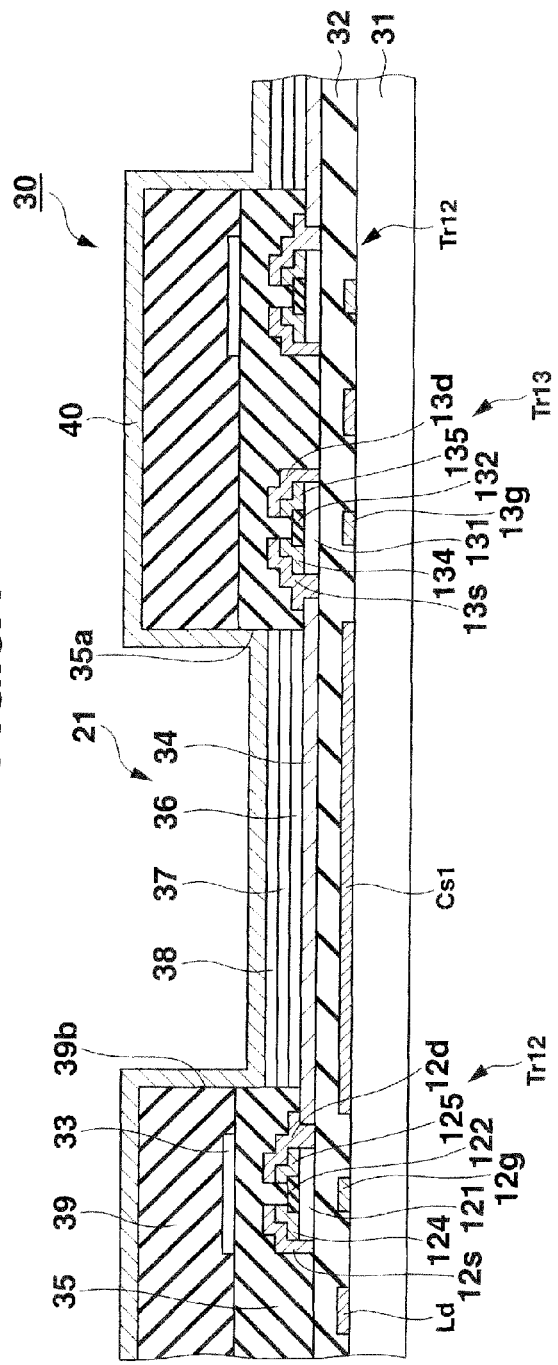
Figure 7:
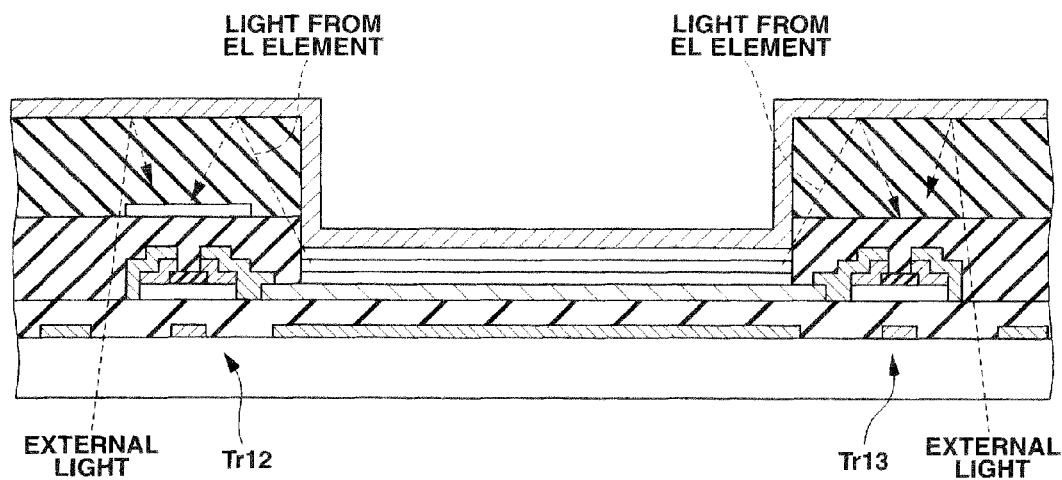
FIG. 7 shows light incident to a pixel.

Next, an explanation is given using FIGS. 5 to 7 of a method for manufacturing a bottom emission type display device of this embodiment. The first selection transistor Tr11 has substantially the same structure as the second selection transistor Tr12 and can be formed using the same processes as for the second selection transistor Tr12 and is therefore omitted from the following explanation.

First, the pixel substrate 31 composed of a glass substrate etc. is prepared. After then depositing a transparent conductive film such as an ITO film on the pixel substrate 31 using sputtering or vacuum deposition techniques, the capacitor electrode Cs1 is formed by patterning using photolithography. Next, a gate conduction film composed of, for example, an Mo film, a Cr film, an Al film, a Cr/Al deposition film, an AlTi alloy film, an AlNdTi alloy film, or an MoNb alloy film etc. is formed using sputtering or vacuum deposition techniques. This is then patterned into the shape for the gate electrodes 12g, 13g of the transistors Tr12 and Tr13 and the data line Ld as shown in FIG. 5A. At this time, the gate electrode 13g of the light-emitting driver transistor Tr13 and the source electrode 11s of the first selection transistor Tr11 are formed so as to partially overlap with the capacitor electrode Cs1 at the contacts 44 and 43. However, the transparent metal oxide such as ITO constituting the capacitor electrode Cs1 has a high contact resistance with the Al. The gate conduction film is therefore an Mo film or an MoNb alloy film of a comparatively low contact resistance with the transparent metal oxide such as ITO. In the case of a top emission type element, the capacitor electrode Cs1 is formed integrally with the gate electrode 13g of the light-emitting driver transistor Tr13 and the source electrode 11s of the first selection transistor Tr11 by patterning of the gate conduction film. The material is therefore not restricted to the material described above.

The insulation film 32 is then formed on the gate electrodes 12g, 13g, the capacitor electrode Cs1, and the data line Ld using a technique such as CVD (Chemical Vapor Deposition), as shown in FIG. 5B.

Next, the semiconductor layers 121 and 131 for the transistors Tr12 and Tr13 are formed on the insulation film 32 using CVD techniques etc. The protective insulation films 122 and 132, and the ohmic contact layers 124, 125, 134, and 135 containing n-type impurities in amorphous silicon are formed on the upper surface of the semiconductor layers 121 and 131 of the transistors Tr12 and Tr13.

Next, after coating a transparent conductive film of ITO etc. or a reflective conductive film and a transparent conductive film of ITO etc. on the insulation film 32 using sputtering or vacuum deposition techniques, the pixel electrodes 34 are formed by patterning using photolithography. After forming the contacts 41 to 43 constituting through holes in the insulation film 32, the source-drain conductive film is formed using sputtering or vacuum deposition techniques. The drain electrodes 12d, 13d, the source electrodes 12s, 13s, the scanning line Ls, and the anode line La are then formed as shown in FIG. 3 and FIG. 5B by patterning using photolithography. At this time the source electrode 13s of the light-emitting driver transistor Tr13 and the drain electrode 12d of the second selection transistor Tr12 are formed so as to partially overlap with the pixel electrodes 34. It is also possible to form contact holes at the insulation film 32 that expose contacts 41 to 43 together with collection terminal sections of each scanning line Ls and connection terminal sections of each data line Ld. If the conductive film constituting the pixel electrodes 34 is deposited after forming the contact holes and the contacts 41 to 43 and is then patterned using photolithography, it is possible to form a three layer structure connecting section where a conductive film constituting the pixel electrodes 34 is interposed between a gate conductive film and a source-drain conductor film at the contact holes and the contacts 41 to 43, together with the pixel electrodes being formed.

An inter-layer insulation film 35 constituted by a silicon nitride film is formed using CVD techniques etc. so as to cover the transistors Tr12 and Tr13 as shown in FIG. 5C. A film having light blocking properties is then deposited over the whole of the pixel substrate 31 including a region covering the first selection transistor Tr11 and a region covering the second selection transistor Tr12 on the inter-layer insulation film 35 using sputtering or vacuum deposition techniques etc. The film is then patterned using photolithography so as to selectively form the light blocking film 33 on these regions. The light blocking film 33 is not formed on the region covering the light-emitting driver transistor Tr13. The opening 35a is then formed on the inter-layer insulation film 35 using photolithography.

Next, the inter-layer insulation film 35 and light blocking film 33 are applied with photosensitive polyamide, exposed via a mask corresponding to the shape of the partition wall 39, are patterned using exposure, and the partition wall 39 is formed as shown in FIG. 6. When the light blocking film 33 is conductive, capacitive coupling and a back gate effect occur between the first selection transistor Tr11 and the second selection transistor Tr12. Forming directly above the partition wall 39 rather than directly above the inter-layer insulation film 35 is therefore preferable.

Organic compound-containing liquid including positive hole injecting material is then selectively applied onto the pixel electrodes 34 encompassed by the opening 35a by a nozzle printing device providing a continuous flow or by an ink jet device emitting the liquid as a plurality of independent droplets. The pixel substrate 31 is then heated under atmospheric conditions so as to volatize the solution for the organic compound-containing liquid so as to form the positive hole injection layer 36. It is also possible to apply the organic compound-containing liquid in a heated atmosphere.

The organic compound-containing liquid containing material that will constitute the interlayer 37 is then applied onto the positive hole injection layer 36 using a nozzle printing device or an inkjet device. Heating and drying in a nitrogen atmosphere, or heating and drying in a vacuum are then carried out, residual solvent is eliminated, and the interlayer 37 is formed. It is also possible to apply the organic compound-containing liquid in a heated atmosphere.

Next, the organic compound-containing liquid containing the light-emitting polymer material (R, G, B) is similarly applied by a nozzle printing device or an inkjet device and heated in a nitrogen atmosphere. Residual solvent is then eliminated and the light-emitting layer 38 is formed. It is also possible to apply the organic compound-containing liquid in a heated atmosphere.

A two-layer structure opposing electrode 40 of a layer composed of material of a low work function such as Li, Mg, Ca or Ba and a light-reflecting conductive layer of Al etc. is formed using vacuum deposition or sputtering at the pixel substrate 31 formed as far as the light-emitting layer 38. In the case of a top emission type element, the opposing electrode 40 is a transparent laminated structure having an optically transparent low work function layer of a material having a low work function such as, for example, Li, Mg, Ca, Ba, etc. with an extremely thin film thickness in the order of 10 nm, and a light reflecting conductive layer ITO etc. of a film thickness in the order of 100 nm to 200 nm formed on the optically transparent low work function layer.

Next, a sealing resin that is an ultraviolet hardening resin or a thermally hardening resin is applied onto the pixel substrate 31 at the outside of the display region where the plurality of pixels 30 is formed. The pixel substrate 31 and the sealed substrate are then pasted together. Next, the sealing resin is hardened using ultraviolet light or heat and the pixel substrate 31 and the sealing substrate are bonded.

The display device 10 is then manufactured as shown in FIG. 6B using the above processes.

In this embodiment, by forming the light blocking film 33 on the first selection transistor Tr11 and the second selection transistor Tr12 for carrying out the switching operation but not forming a light blocking film on the light-emitting driver transistor Tr13 for carrying out the driving operation, as shown in FIG. 7, light emitted from the organic EL element 21 and external light is incident only to the light-emitting driver transistor Tr13 and it is therefore possible to make it difficult for this light to be incident to the first selection transistor Tr11 and the second selection transistor Tr12.

Figure 8:
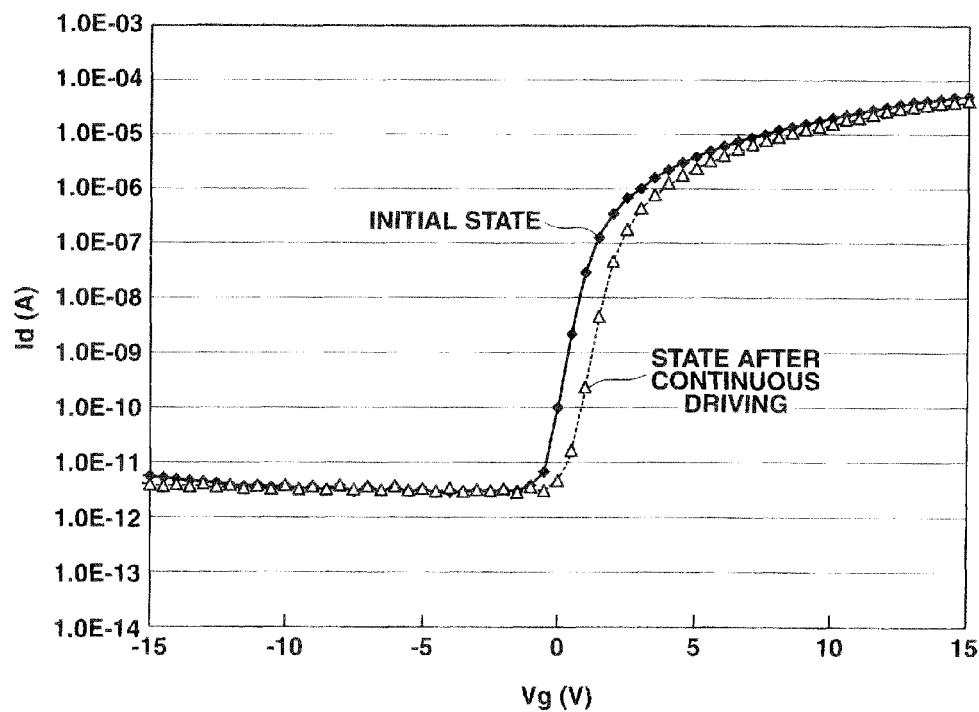
FIG. 8 is a graph showing change in threshold voltage when an amorphous silicon TFT is driven for a long time.

FIG. 8 is a graph showing a drain-source current Id versus a gate voltage Vg when a voltage of 10 V is applied across the drain-source under an environment where light is not incident at the amorphous silicon TFT in an initial state, and a drain-source current Id versus a gate voltage Vg when a voltage of 10 V is applied across the drain-source under an environment where light is not incident at the amorphous silicon TFT after continuously driving a current Id of 2.5 A across the drain-source with no light incident, at a temperature of 70° C. for 50 hours, with a voltage of 5 V applied across the drain-source at a duty of 100%. At the amorphous silicon TFT, the gate threshold voltage shifts in the plus direction after continuous driving compared to the amorphous silicon TFT in the initial state. This means that the gate threshold voltage of an amorphous silicon TFT where current continues to flow under an environment where light is not irradiated shifts in the plus direction.

Figure 9:
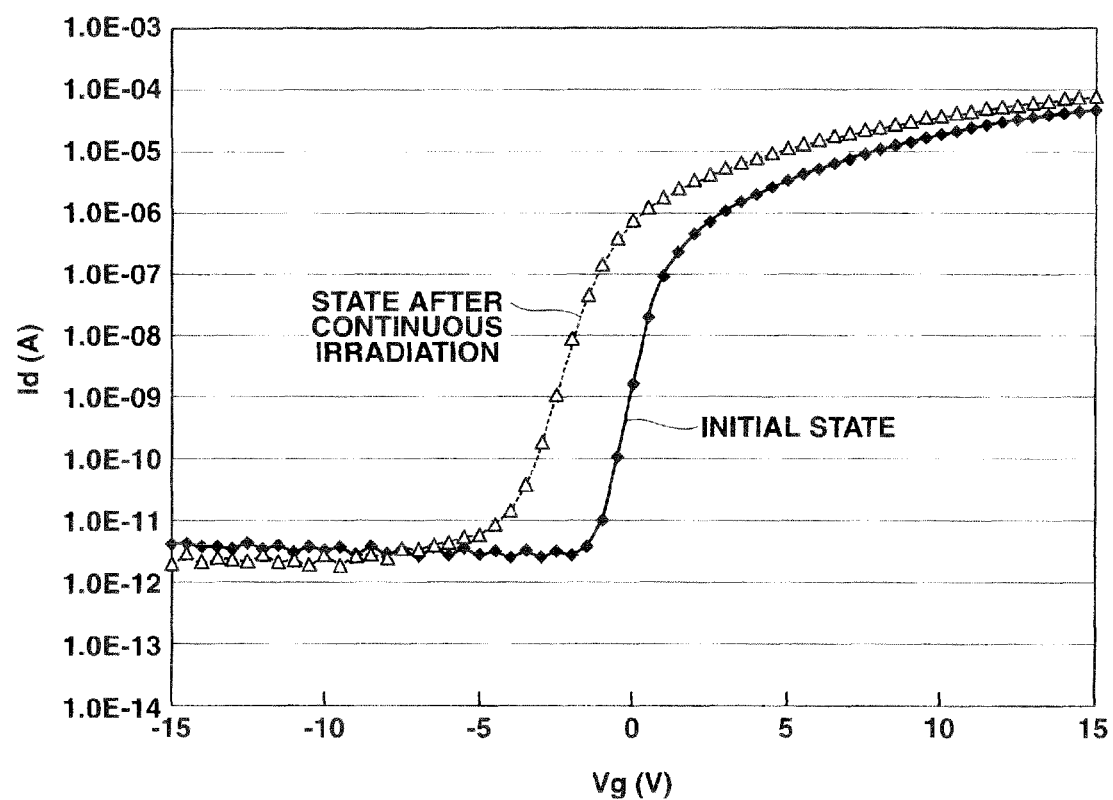
FIG. 9 is a graph showing change in threshold voltage when an amorphous silicon TFT irradiates light for a long time.

Next, change in threshold voltage when an n-channel transistor using amorphous silicon is continuously driven while being irradiated with light is shown in FIG. 9. FIG. 9 is a graph showing drain-source current Id versus gate voltage Vg when a voltage of 10 V is applied across the drain-source under an environment where light is not incident at the amorphous silicon TFT in an initial state, and a current Id across the drain-source versus the gate voltage Vg when a voltage of 10 V is applied across the drain-source under an environment where light is not incident at an amorphous silicon TFT after driving continuously under an environment where 2500 lux of light is incident, at a temperature of 70° C. for 72 hours taking a drain-source voltage to be zero volts, while applying a gate voltage of plus or minus 15 V at a duty ratio of 1/240. At the amorphous silicon TFT after continuous driving the gate threshold voltage shifts in the minus direction compared to the amorphous silicon TFT in the initial state. This means that when light is continuously radiated in the state where a gate voltage Vg is applied to the gate, the gate threshold voltage of the amorphous silicon TFT shifts in a minus direction.

The light-emitting driver transistor Tr13 of this embodiment is a transistor that controls light emitted by the organic EL element 21 and changes in the threshold voltage of this transistor have a particularly large influence on the amount of light generated by the display device. This influence is particularly substantial when the amount of light generated by the organic EL element using a voltage gradation signal is controlled. In this embodiment, by utilizing the phenomenon shown in FIGS. 8 and 9, it is ensured that light enters into the light-emitting driver transistor Tr13 that is more heavily influenced by changes in the threshold voltage. The extent of shift in the threshold voltage in the plus direction due to aging resulting from driving can then be cancelled out by a shift in the minus direction due to the incident light. It is therefore possible to maintain a threshold voltage that is close to the initial state or to an equivalent state. In this embodiment, it is possible to suppress changes in controlling the quantity of light emitted as a result of aging from driving if it is possible to suppress changes in the threshold voltage.

On the other hand, there is also the problem of leakage current rising when the transistors are off when the first selection transistor Tr11 and the second selection transistor Tr12 carrying out the switching irradiate light. For example, when the first selection transistor Tr11 is not put sufficiently off, charge is accumulated at the capacitor Cs and the voltage of the capacitor Cs becomes high. Current flowing at the light-emitting driver transistor Tr13 therefore becomes different to the current that flowed in the initial state and there is the fear that the intensity of light emitted by the organic EL element 21 will modulate. In particular, there is the fear that the voltage of the gate electrode 13g of the light-emitting driver transistor Tr13 will rise and that light will be emitted by the organic EL element 21 and that the contrast ratio will become small regardless of whether a dark display (non-light-emitting) gradation signal is supplied.

Further, when the second selection transistor Tr12 is not sufficiently off during the non-selection period, a portion of the current intended to flow at the organic EL element 21 during the non-selection period $T_{NSE}$ flows to the data line Ld via the second selection transistor Tr12. This means that not only does the organic EL element 21 not emit light at the normal intensity, but also charge accumulated at the capacitor Cs of the pixel 30 connected to the data line Ld at the selection period $T_{SE}$ at this time does not become the desired value.

It is therefore preferable for the light incident to the transistors carrying out the switching operations to be suppressed. If these transistors are also small compared to the light-emitting driver transistor Tr13 the influence of the change in threshold voltage resulting from aging caused by driving will also become small compared to Tr13 and will therefore not present a problem.

According to the display device and the method for manufacturing the display device of this embodiment, when a light blocking film is only formed on transistors carrying out a switching operation, light enters into light emission driving transistors. It is therefore possible to provide a display device and a method for manufacturing a display device that is capable of suppressing changes in threshold voltage resulting from aging of the drive elements resulting from driving.

Second Embodiment

An explanation is now given using the drawings of a display device and a method for manufacturing a display device of a second embodiment of the present invention. The display device of this embodiment differs to the display device of the first embodiment in that in this embodiment, rather than forming a light blocking film at the organic EL element, a recess is formed at the upper surface of the partition wall. Portions common to the first embodiment are given the same numerals and are not explained in detail.

Figure 10:
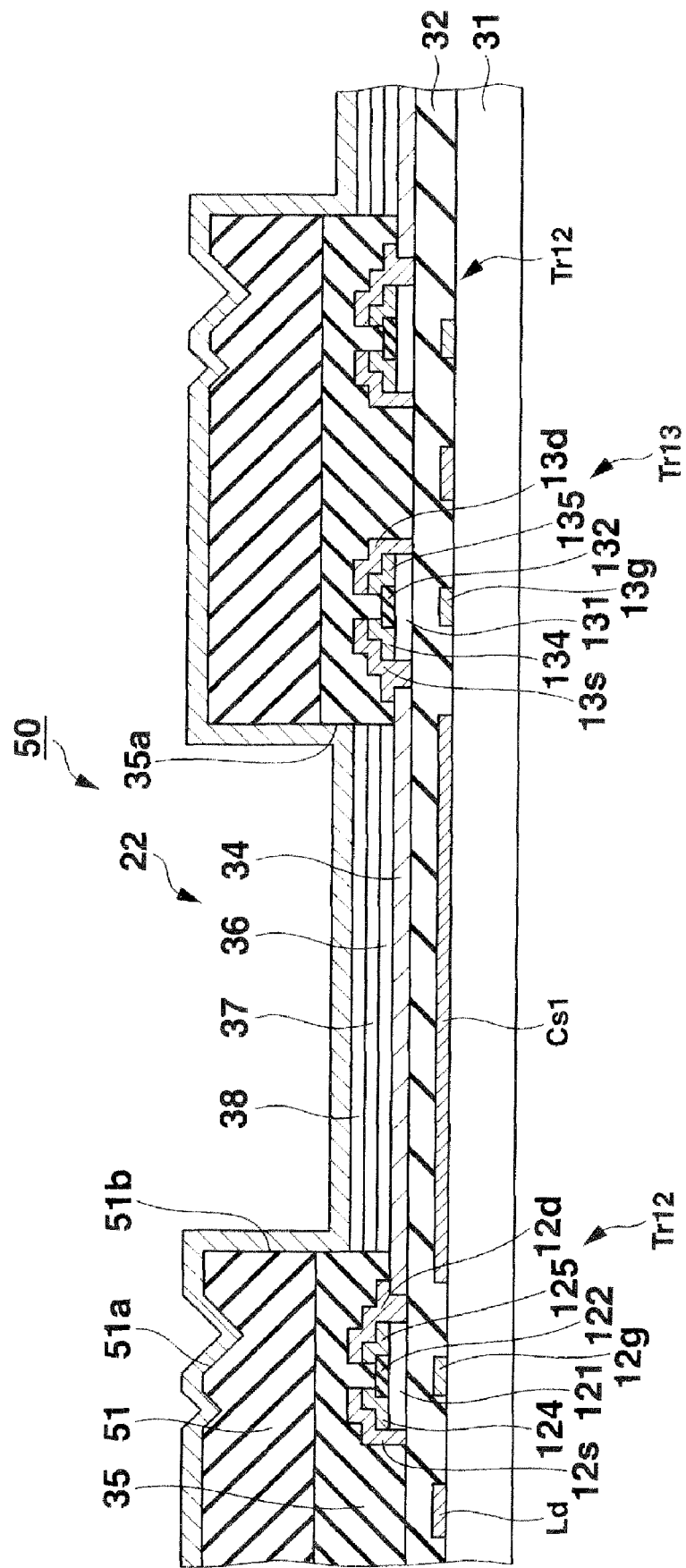
FIG. 10 is a cross-sectional view showing an example structure for a display device of a second embodiment of the present invention.

A cross-sectional view of a display device of this embodiment is shown in FIG. 10. FIG. 10 corresponds to a cross-sectional view a long line IV-IV of FIG. 3 of the first embodiment.

A display device 10 of this embodiment has groups of pixels 50 for three colors of red (R), green (G), and blue (B) provided on the pixel substrate 31 as in the first embodiment. A plurality of the groups is then repeatedly arranged in a row direction (lateral direction of FIG. 1), with pluralities of pixels for the same color being arranged in the column direction (vertical direction in FIG. 1). Each pixel 50 is equipped with an organic EL element 22 that respectively emits R, G, and B light, and a pixel circuit DS that actively operates the organic EL element 22.

As with the first embodiment, the pixel circuit DS includes the first selection transistor Tr11, the second selection transistor Tr12, the light-emitting driver transistor Tr13, the capacitor Cs, and the organic EL element 22.

As with the first embodiment, the organic EO element 22 includes pixel electrodes 34, a partition wall 51, an inter-layer insulation film 35, the positive hole injection layer 36, the interlayer 37, the light-emitting layer 38, and the opposing electrode 40.

Figure 11:
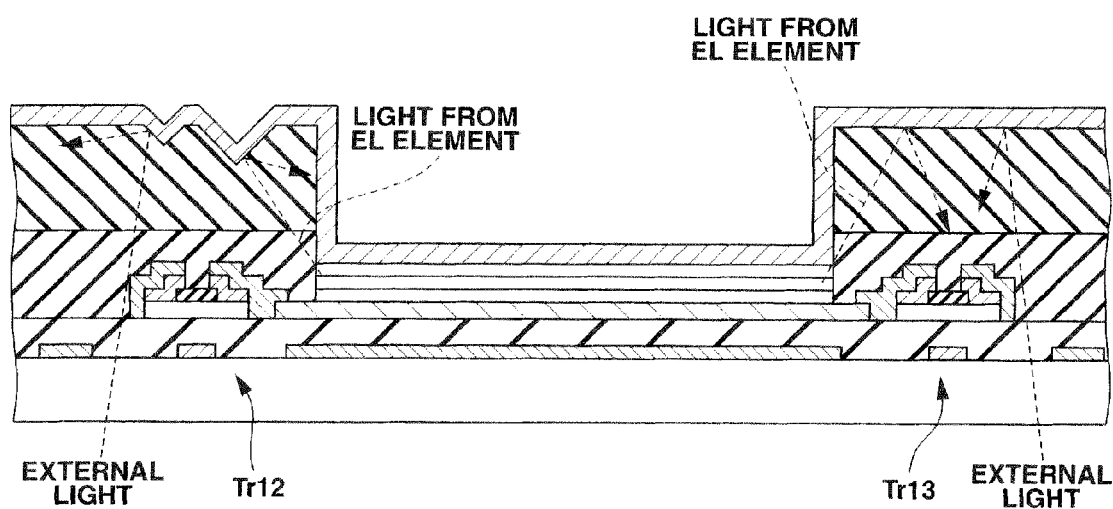
FIG. 11 is a diagram showing light incident to a pixel.

In this embodiment, the partition wall 51 is formed from an insulating material such as, for example, photosensitive polyamide. The partition wall 51 is formed in the shape of a stripe as in the first embodiment and has an opening 51b. The partition wall 51 is such that a recess 51a is formed at a region facing the first selection transistor Tr11 and the second selection transistor Tr12, but the recess 51a is not formed at a region facing the light-emitting driver transistor Tr13. The cross-sectional shape of the recess 51a is, for example, substantially triangular and has, for example, a plane shape that appears as a rectangular conical-shaped cavity when viewed from above. The opposing electrode 40 consisting of two layers of a metal layer of a metal of a low work function such as Li, Mg, Ba, or Ca and a highly reflective metal layer of aluminum etc. is formed on the upper surface of the partition wall 51. By forming the recess 51a, as schematically depicted in FIG. 11, light emitted from the organic EL element and external light is diffused by the surface of the recess 51a so as to be scattered, it is therefore possible to suppress the amount of light incident to the region directly below where the recess 51a is formed. It is therefore preferable for the angle of inclination of the recess 51a to be 45 degrees plus or minus 15 degrees to ensure that incident light is easily reflected. The shape of the recess 51a is also not limited to being a quadrangular pyramid and can also be conical.

The method for manufacturing the display device to this embodiment is now explained using FIGS. 12 and 13.

First, the transistors Tr11 to Tr13, the pixel electrodes 34, and the inter-layer insulation film 35 etc. are formed on the pixel substrate 31 as with the method of manufacturing the display device 10 of the first embodiment.

Next, as shown in FIG. 12A, for example, a photosensitive material such as, for example, an unhardened resin 81 of a positive type photosensitive polyamide etc. is applied onto the pixel substrate 31. The photosensitive material is then exposed via a mask 80 as shown in FIG. 12B. A lattice shaped slit 80b formed so as to correspond to a region where the recess 51a is formed is then formed at the mask 80 having an opening 80a corresponding to a region for forming the organic EL element 22. It is therefore possible to adjust the extent to which the polyamide is exposed by providing the slit 80b at the mask and appropriately adjusting the width of the opening of the slit 80b and it is therefore possible to appropriately adjust the depth of the recess 51a. When a negative type photosensitive material is used, the mask opening and the slit are the reverse of the case for the negative type. Exposure and sintering is then carried out so as to form the partition wall 51 as shown in FIG. 13A.

Next, the positive hole injection layer 36, the interlayer 37, the light-emitting layer 38, and the opposing electrodes 40 are formed on the partition wall 51 as in the first embodiment. A sealing resin such as ultraviolet hardening resin or a thermally hardening resin is then applied, and the pixel substrate 31 and the sealing substrate are pasted together. Next, the sealing resin is hardened using ultraviolet light or heat and the pixel substrate 31 and the sealing substrate are bonded.

The display device 10 is then manufactured as shown in FIG. 13B using the above processes.

In this embodiment, light emitted by the organic EL element 22 and external light etc. is incident to the light-emitting driver transistor Tr13 as a result of forming the recess 51a at the upper surface of the partition wall 51. It is therefore possible to ensure that it is difficult for light to become incident to the first selection transistor Tr11 and the second selection transistor Tr12 carrying out the switching operation. It is therefore possible to maintain the threshold voltage at a state close to the initial state by ensuring that light enters into the light-emitting driver transistor Tr13 that is substantially affected by changes in the threshold voltage and by then ensuring that shift in the threshold voltage towards the plus direction due aging resulting from driving, is canceled out by shift in the minus direction due to the light.

In particular, in this embodiment, it is possible to form the recess 51a at the same time as forming the partition wall 51 by employing photosensitive material and by providing a slit in the mask. It is also possible to form the recess 51a that suppresses light incident to the transistors Tr11 and Tr12 without particularly increasing the number of processes and manufacturing costs therefore do not increase.

According to the display device and the method for manufacturing the display device of this embodiment, it is possible to provide a display device and a method for manufacturing a display device that is capable of suppressing changes in threshold voltage due to aging resulting from driving.

Third Embodiment

Next, a description is given using the drawings of a display device of a third embodiment of the present invention.

The display device of this embodiment differs to the display device of the first embodiment in that in the first embodiment a description is given of an example to the case where the pixel driver circuit is provided with three transistors but in this embodiment, a pixel circuit DS2 for the pixels is provided with two transistors. Features common to the first embodiment are given the same numerals and are not explained in detail.

Figure 14:
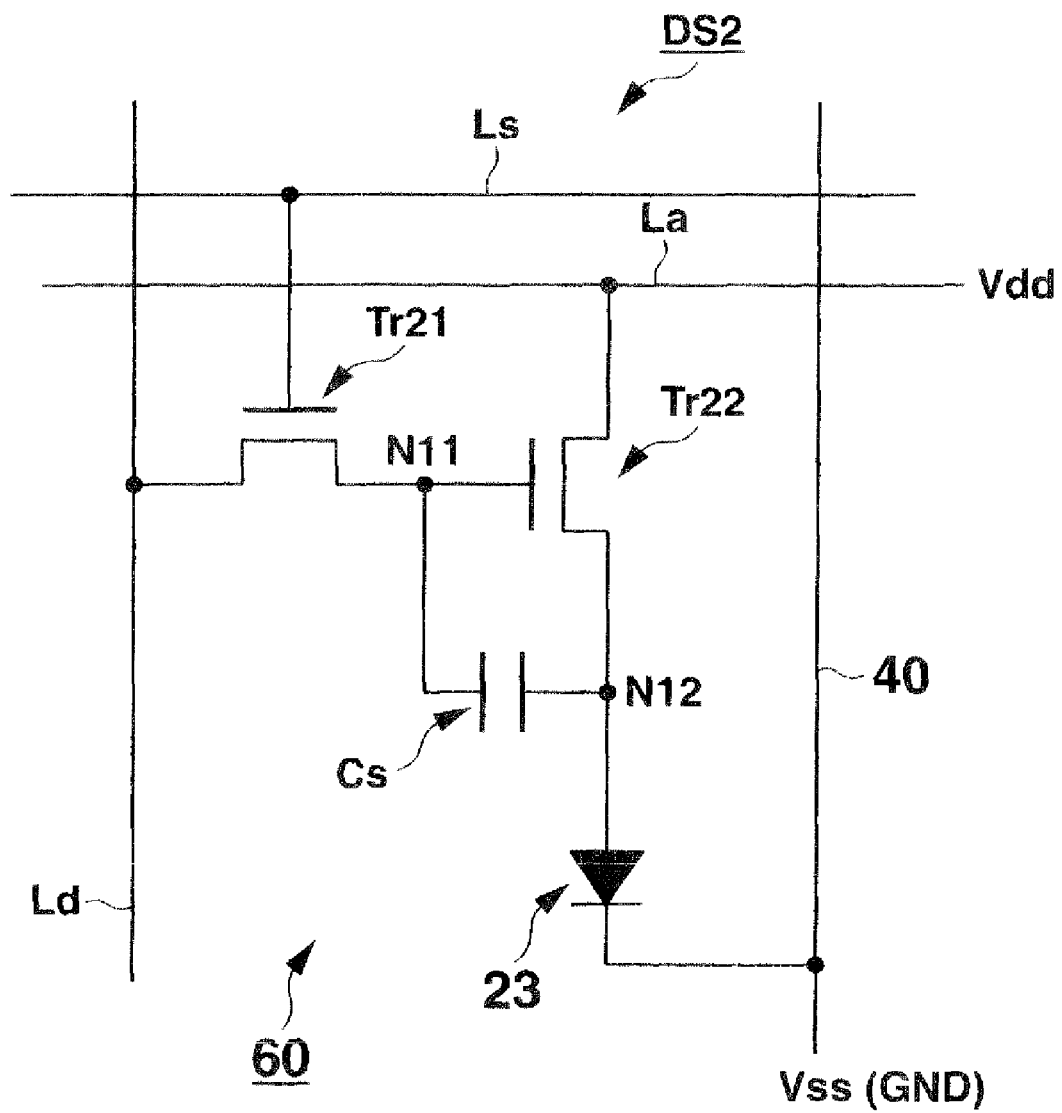
FIG. 14 is an equivalence circuit diagram showing a pixel drive circuit for a display device of a third embodiment of the present invention.
Figure 15:
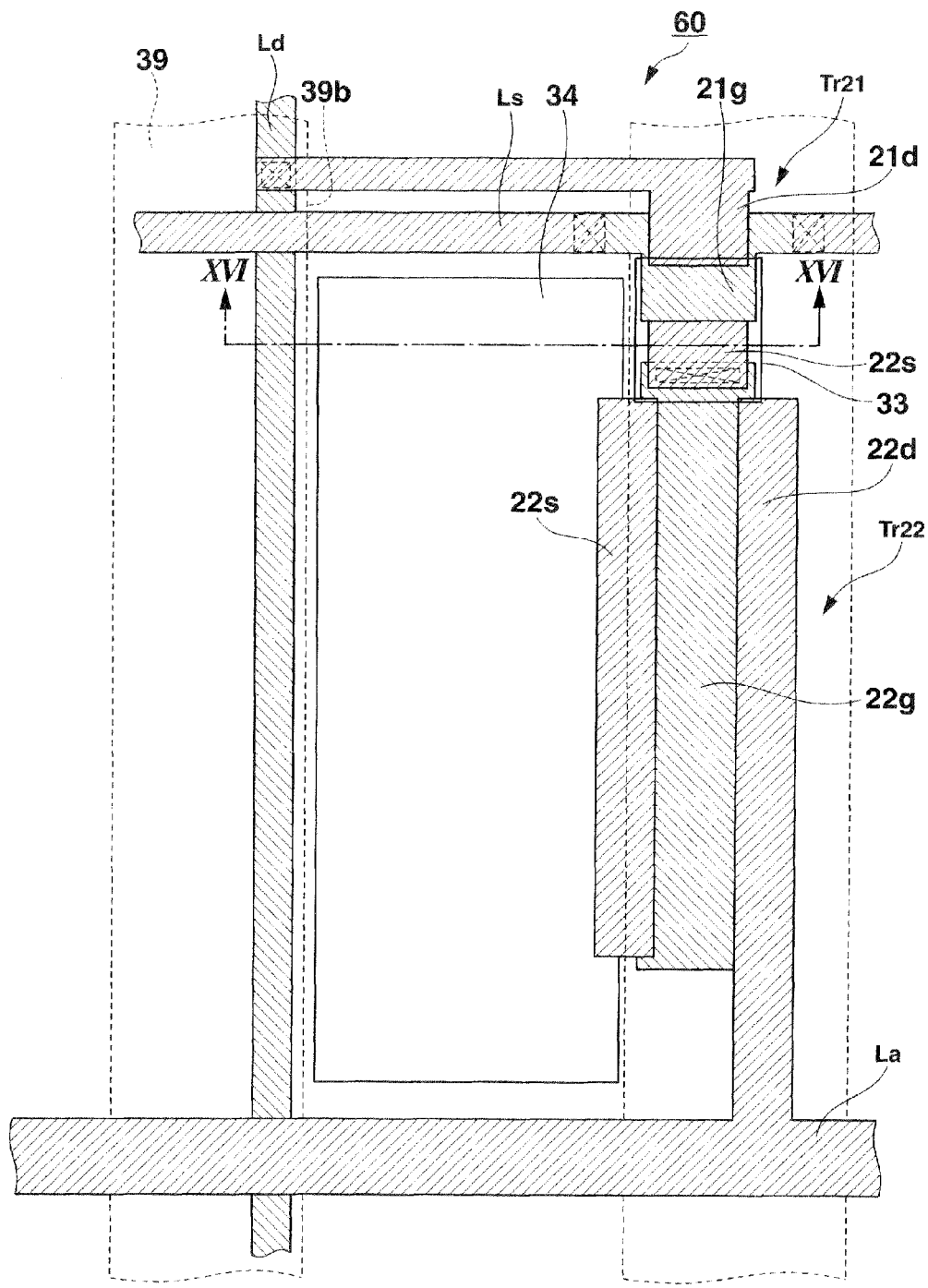
FIG. 15 is a plan view of a pixel.
Figure 16:
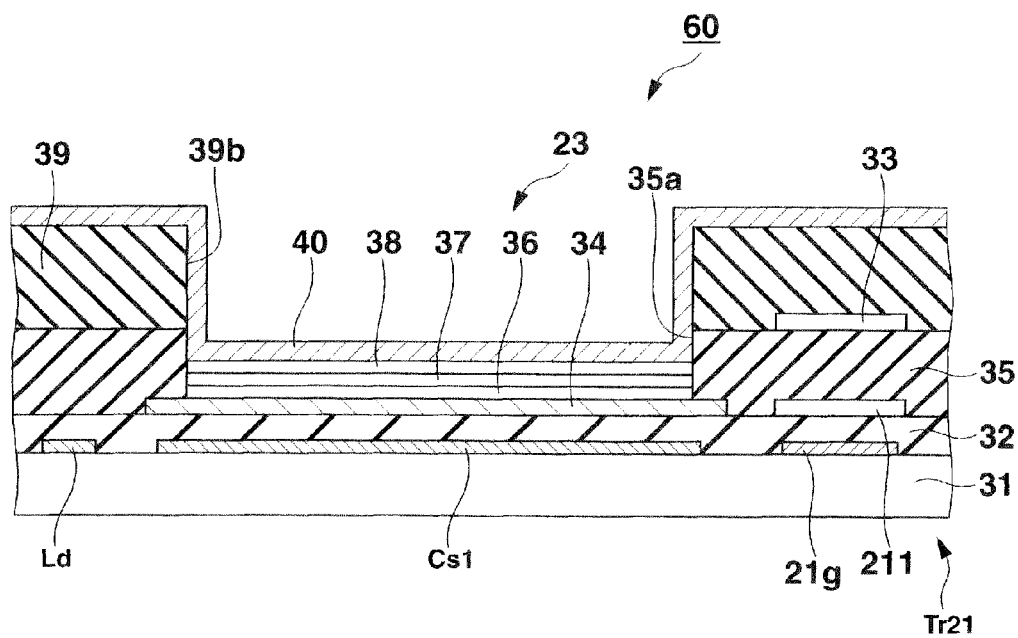
FIG. 16 is a cross-sectional view along line XVI-XVI shown in FIG. 15.

The pixel circuit DS2 for this embodiment is shown in FIG. 14. A plan view of a pixel 60 of this embodiment is shown in FIG. 15, and a cross-sectional view taken along line XVI-XVI of FIG. 15 is shown in FIG. 16. FIG. 16 shows a cross-sectional view of a region where a gate electrode 21g of a selection transistor Tr21 is formed in order to clarify the position of the light blocking film 33. Only a semiconductor layer 211 and the gate electrode 21g of the selection transistor Tr21 are shown in FIG. 16 and the stricture of the selection transistor Tr21 and the light-emitting driver transistor Tr22 is the same as for the first embodiment.

As shown in FIG. 14, the pixel circuit DS2 of this embodiment includes the selection transistor Tr21, the light-emitting driver transistor Tr22, the capacitor Cs, and an organic EL element 23. A gate terminal of the transistor Tr21 is connected to the scanning line Ls, a drain terminal is connected to the data line Ld, and a source terminal is connected to a contact N11. A gate terminal of the transistor Tr22 is connected to the contact N11, a drain terminal is connected to an anode line La, and a source terminal is connected to a contact N12. The capacitor Cs is connected to the gate terminal and a source terminal of the transistor Tr12. The capacitor Cs is an auxiliary capacitance provided additionally across the gate and source of the transistor Tr12 or is a capacitance component constituted by parasitic capacitances and the auxiliary capacitance. An anode terminal (anode electrode) of the organic EL element 23 is connected to the contact 12, and a cathode terminal (cathode electrode) is connected to a cathode line (common voltage line).

The organic EL element 23 includes the pixel electrodes 34, the light blocking film 33, the inter-layer insulation film 35, the positive hole injection layer 36, the interlayer 37, the light-emitting layer 38, the partition wall 39, and the opposing electrode 40.

In this embodiment, the selection transistor Tr21 shown in the pixel circuit DS2 carries out a switching operation. This means that, as shown in FIGS. 15 and 16, the light blocking film 33 is formed on the selection transistor Tr21, but the light blocking film 33 is not formed on the driving transistor Tr22. As a result, by forming the light blocking film 33 only on the transistor Tr21 that carries out the switching operation as in the first embodiment so as to ensure that light enters from above the light-emitting driver transistor Tr21, it is possible to provide a display device and a method for manufacturing the display device that is capable of suppressing changes in the threshold voltage due to aging caused by driving of the driving elements.

Fourth Embodiment

This embodiment differs from each of the above embodiments in that the circuit for driving the pixels includes just two transistors, one selection transistor, and one light-emitting driver transistor, as in the third embodiment described above, and in that a recess is formed on the partition wall rather than forming a light blocking film on the inter-layer insulation film. Portions that are common to the embodiment described above are given the same numerals and are not described in detail.

Figure 17:
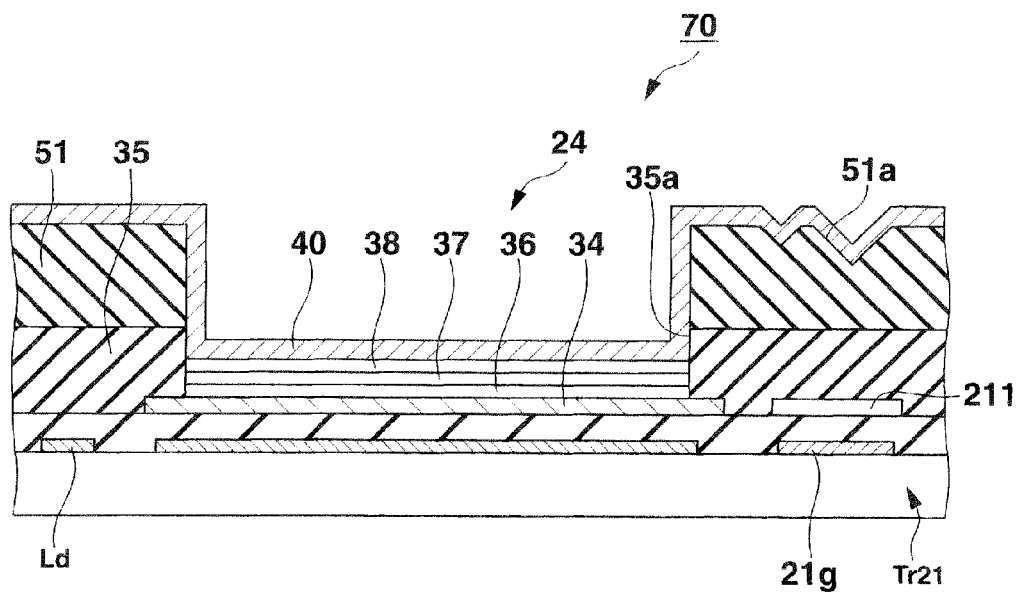
FIG. 17 is a cross-sectional view showing an example structure for a display device of a fourth embodiment of the present invention.

A pixel 70 of this embodiment is shown in FIG. 17. The planar shape of the pixels 70 of this embodiment and the pixels 60 of the third embodiment is substantially the same with the exception of the light blocking film or the recess being formed, with FIG. 17 corresponding to a cross-sectional view along line XVI-XVI of FIG. 15 of the third embodiment. A cross-sectional view of the region where the gate electrode 21g of the selection transistor Tr21 is formed is also shown in FIG. 17 in order to clarify the position of the recess. Only the semiconductor layer 211 and the gate electrode 21g of the selection transistor Tr21 are shown in FIG. 17 and the structure of the selection transistor Tr21 and the light-emitting driver transistor Tr22 is the same as for the first embodiment.

As in the third embodiment, an organic EL element 24 and a pixel circuit DS2 for the pixel is provided. The organic EL element 24 includes the pixel electrode 34, the inter-layer insulation film 35, the positive hole injection layer 36, the interlayer 37, the light-emitting layer 38, the partition wall 51, and the opposing electrode 40.

At the organic F element 24 of this embodiment, as shown in FIG. 17, a recess 52a is formed at a region facing the selection transistor Tr21 on the upper surface of the partition wall 52. As shown in FIG. 11 of the second embodiment, as a result of the presence of the recess 52a, light emitted by the organic EL element 24 and external light is reflected by the recess 51a and it is possible to suppress this light from becoming incident to the selection transistor Tr21 formed directly below the recess 51a. On the other hand, the recess 51a is not formed on the light-emitting driver transistor Tr22 to which light is therefore incident. It is therefore possible to suppress changes in the threshold voltage as explained above.

The present invention is not limited to the above embodiments, and various modifications and applications are possible.

For example, an explanation is provided giving an example in each of the embodiments of a configuration where the pixels are driven by a voltage gradation signal. However, the present invention is by no means limited in this respect and it is also possible for the amount of light emitted by the organic EL elements to be controlled by a write signal as a result of adjusting the amount of current. This has the advantages that if it is possible to suppress rises in the threshold voltage even before current right signals, it is possible to suppress shifts in the threshold voltage while operating normally, and it is possible to reduce the amount of current flowing in the organic EL element.

In the above embodiments, an explanation is provided giving the example of a bottom emitter type organic EL element but the present invention is by no means limited in this respect and it is also possible to use a top emission type organic EL element.

In each of the embodiments described above, a description is provided given an example of forming a light blocking film or a recess at a region facing the transistors that carry out the switching operation as shown, for example, in FIG. 3 that is provided with substantially the same surface area. However, the present invention is by no means limited in this respect. It is also possible for the surface area of the transistors carrying out the switching operation to be larger or smaller, providing that the incidence of light to the light-emitting driver transistor remains superior and the incidence of light to the transistor carrying out the switching operation can be suppressed. The planar shape of light blocking film is not limited to being rectangular and can also be an arbitrary shape such as circular or polygonal.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2008-88331 filed on Mar. 28, 2008 and including specification, claims, drawings and summary. The disclosure of the above Japanese Patent Application is incorporated herein by reference in its entirety.

What is claimed is:

1. A display device comprising:
   a light-emitting element which includes a pixel electrode, an opposing electrode, and at least one light-emitting layer between the pixel electrode and the opposing electrode;
   a driver element which controls a current flowing in the light-emitting element;
   a switching element which switches the driver element;

at least one insulation film which covers the driver element, the switching element, and a side of said at least one light-emitting layer; and a light-blocking film which is formed between the opposing electrode and the switching element but is not formed between the opposing electrode and the driver element, wherein the opposing electrode includes a first region which faces the light-blocking film that is above the switching element, and a second region which faces the driver element, wherein the light-blocking film shields the switching element from light which is reflected by the opposing electrode, and wherein the driver element is adapted to be exposed to the light which is reflected by the opposing electrode.

2. The display device according to claim 1, wherein each of the driver element and the switching element comprise an amorphous silicon thin-film transistor.

3. The display device according to claim 1, wherein the light-blocking film is formed on said at least one insulation film.

4. The display device according to claim 3, further comprising a partition wall formed on said at least one insulation film and the light-blocking film.

5. The display device according to claim 4, wherein the opposing electrode covers the partition wall.

6. The display device according to claim 1, wherein the light-blocking film is formed from at least one of chrome (III) oxide, cobalt-iron-chrome oxide, and an amorphous silicon.

7. The display device according to claim 1, further comprising a scanning line; a data line; and an anode line, wherein:

the driver element comprises a light-emitting driver transistor;

the switching element comprises a first selection transistor and a second selection transistor;

a drain electrode of the light-emitting driver transistor is connected to the anode line, and a source electrode of the light-emitting driver transistor is connected to the light-emitting element;

a gate electrode of the first selection transistor is connected to the scanning line, a drain electrode of the first selection transistor is connected to the anode line, and a source electrode of the first selection transistor is connected to a gate electrode of the light-emitting driver transistor; and a gate electrode of the second selection transistor is connected to the scanning line, a drain electrode of the second selection transistor is connected to the source electrode of the light-emitting driver transistor, and a source electrode of the second selection transistor is connected to the data line.

8. A display device comprising:

a light-emitting element which includes a pixel electrode, an opposing electrode, and at least one light-emitting layer between the pixel electrode and the opposing electrode;

a driver element which controls a current flowing in the light-emitting element;

a switching element which switches the driver element; and at least one insulation film which covers the driver element, the switching element, and a side of said at least one light-emitting layer, wherein said at least one insulation film has a recess at a region facing the switching element.

9. The display device according to claim 8, wherein said at least one insulation film includes a protective insulation film and a partition wall, and wherein the opposing electrode covers the partition wall.

10. The display device according to claim 9, wherein the recess is formed in the partition wall.

11. The display device according to claim 9, wherein the recess is formed at the region facing the switching element but is not formed at a region facing the driver element.

12. The display device according to claim 11, wherein the opposing electrode includes a first region which faces the recess that is above the switching element, and a second region which faces the driver element.

13. The display device according to claim 12, wherein the recess prevents light which is reflected by the opposing electrode from becoming incident on the switching element, and wherein the driver element is adapted to be exposed to the light which is reflected by the opposing electrode.

14. The display device according to claim 1, wherein the opposing electrode comprises:

a layer of conductive material including at least one Li, Mg, Ca and Ba; and a reflective conductive layer.

15. The display device according to claim 1, further comprising a scanning line; a data line; and an anode line, wherein:

the driver element comprises a light-emitting driver transistor;

the switching element comprises a selection transistor;

one of a drain electrode and a source electrode of the light-emitting driver transistor is connected to the anode line, and the other of the drain electrode and the source electrode of the light-emitting driver transistor is connected to the light-emitting element; and a gate electrode of the selection transistor is connected to the scanning line, one of a drain electrode and a source electrode of the selection transistor is connected to a gate electrode of the light-emitting driver transistor, and the other of the drain electrode and the source electrode of the selection transistor is connected to the data line.

* * * * *